US011024839B2

United States Patent
Toma et al.

(10) Patent No.: US 11,024,839 B2
(45) Date of Patent: Jun. 1, 2021

(54) TRANSITION METAL-CONTAINING COMPOSITE HYDROXIDE AND PRODUCTION METHOD THEREOF, AND PRODUCTION METHOD OF POSITIVE ELECTRODE ACTIVE MATERIAL FOR NONAQUEOUS ELECTROLYTE SECONDARY BATTERY

(71) Applicant: SUMITOMO METAL MINING CO., LTD., Tokyo (JP)

(72) Inventors: Takahiro Toma, Ehime (JP); Hiroko Senba, Ehime (JP); Taira Aida, Ehime (JP); Tetsufumi Komukai, Ehime (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 202 days.

(21) Appl. No.: 16/461,072

(22) PCT Filed: Nov. 21, 2017

(86) PCT No.: PCT/JP2017/041849
§ 371 (c)(1),
(2) Date: May 15, 2019

(87) PCT Pub. No.: WO2018/097136
PCT Pub. Date: May 31, 2018

(65) Prior Publication Data
US 2019/0379038 A1    Dec. 12, 2019

(30) Foreign Application Priority Data
Nov. 22, 2016    (JP) .............................. JP2016-226872

(51) Int. Cl.
*H01M 4/36*    (2006.01)
*C01G 53/00*    (2006.01)
(Continued)

(52) U.S. Cl.
CPC .......... *H01M 4/364* (2013.01); *C01G 53/006* (2013.01); *C01G 53/04* (2013.01); *C30B 7/14* (2013.01);
(Continued)

(58) Field of Classification Search
CPC ...... C01G 53/006; C01G 53/04; C01G 53/50; C01P 2004/03; C01P 2004/20;
(Continued)

(56) References Cited

U.S. PATENT DOCUMENTS

| | | | |
|---|---|---|---|
| 2014/0011090 A1 | 1/2014 | Toya et al. | |
| 2016/0093885 A1 | 3/2016 | Kamata et al. | |

FOREIGN PATENT DOCUMENTS

| | | | |
|---|---|---|---|
| JP | 2011-119092 A | 6/2011 | |
| JP | 2012-246199 A | 12/2012 | |

(Continued)

OTHER PUBLICATIONS

International Search Report and Written Opinion dated Feb. 27, 2018, from International Application No. PCT/JP2017/041849, 7 sheets.

*Primary Examiner* — Victoria H Lynch
(74) *Attorney, Agent, or Firm* — Katten Muchin Rosenman LLP

(57) ABSTRACT

A transition metal-containing composite hydroxide comprises secondary particles having: a center portion of fine primary particles; and an outer-shell portion having a high-density layer of plate-shaped primary particles formed outside the center portion, a low-density layer of the fine primary particles formed outside the high-density layer, and an outer-shell layer of the plate-shaped primary particles formed outside the low-density layer. The composite hydroxide is obtained by a method comprising a nucleation step in an oxidizing atmosphere and a particle growth step, (Continued)

the particle growth step comprising: a first stage of maintaining the oxidizing atmosphere; a second stage of switching to and maintaining a non-oxidizing atmosphere; a third stage of switching again to and maintaining the oxidizing atmosphere; and a fourth stage of switching again to and maintaining the non-oxidizing atmosphere.

18 Claims, 4 Drawing Sheets

(51) Int. Cl.
*C01G 53/04* (2006.01)
*C30B 7/14* (2006.01)
*C30B 29/22* (2006.01)
*H01M 4/485* (2010.01)
*H01M 4/505* (2010.01)
*H01M 4/525* (2010.01)
*H01M 10/0525* (2010.01)
*H01M 4/02* (2006.01)

(52) U.S. Cl.
CPC .............. *C30B 29/22* (2013.01); *H01M 4/366* (2013.01); *H01M 4/485* (2013.01); *H01M 4/505* (2013.01); *H01M 4/525* (2013.01); *H01M 10/0525* (2013.01); *C01P 2004/51* (2013.01); *C01P 2004/61* (2013.01); *H01M 2004/028* (2013.01); *H01M 2220/20* (2013.01)

(58) Field of Classification Search
CPC .............. C01P 2004/50; C01P 2004/51; C01P 2004/61; C01P 2004/62; C01P 2004/82; C30B 29/22; C30B 7/14; H01M 10/0525; H01M 2004/028; H01M 2220/20; H01M 4/364; H01M 4/366; H01M 4/485; H01M 4/505; H01M 4/525
See application file for complete search history.

(56) References Cited

FOREIGN PATENT DOCUMENTS

| | | | |
|---|---|---|---|
| JP | 2013-147416 | A | 8/2013 |
| JP | 2015-191848 | A | 11/2015 |
| WO | 2012/131881 | A1 | 10/2012 |
| WO | 2014/181891 | A1 | 11/2014 |

TRANSITION METAL-CONTAINING COMPOSITE HYDROXIDE AND PRODUCTION METHOD THEREOF, AND PRODUCTION METHOD OF POSITIVE ELECTRODE ACTIVE MATERIAL FOR NONAQUEOUS ELECTROLYTE SECONDARY BATTERY

TECHNICAL FIELD

The present invention relates to a transition metal-containing composite hydroxide and a production method thereof, and a production method of a positive electrode active material for a nonaqueous electrolyte secondary battery obtained by using this transition metal-containing composite hydroxide as a precursor.

BACKGROUND ART

In recent years, with the widespread use of mobile electronic devices such as mobile phones, laptop type personal computers, and the like, development of a small and light nonaqueous electrolyte secondary battery having high energy density is strongly desired. Development of a high-output secondary battery as a power source for electric vehicles such as hybrid electric vehicles, plug-in hybrid electric vehicles, battery-powered electric vehicles and the like is also strongly desired.

As a secondary battery satisfying such a requirement, there is a lithium ion secondary battery that is one type of nonaqueous electrolyte secondary battery. This lithium ion secondary battery comprise a negative electrode, a positive electrode, a nonaqueous electrolyte, and the like, and an active material capable of insertion/de-insertion of lithium is used as a material of the negative electrode and the positive electrode.

Among lithium ion secondary batteries, lithium ion secondary batteries using a lithium transition metal-containing composite oxide having a layered rock salt type or spinel type crystal structure as a positive electrode material can obtain a voltage of 4V class, so research and development thereof is currently being actively conducted as a battery having a high energy density, and some are being put to practical use.

As the positive electrode active material for the nonaqueous electrolyte secondary battery which is the positive electrode material of the lithium ion secondary battery, lithium transition metal-containing composite oxides such as lithium cobalt composite oxide ($LiCoO_2$) particles which are relatively easy to synthesize, lithium nickel composite oxide ($LiNiO_2$) particles using nickel that is cheaper than cobalt, lithium nickel cobalt manganese composite oxide ($LiNi_{1/3}Co_{1/3}Mn_{1/3}O_2$) particles, lithium manganese composite oxide ($LiMn2O_4$) particles using manganese, lithium nickel manganese composite oxide ($LiNi_{0.5}Mn_{0.5}O_2$) particles, and the like have been proposed.

Incidentally, in order to obtain a lithium ion secondary battery having excellent cycling characteristics and output characteristics, it is necessary that the positive electrode active material for a nonaqueous electrolyte secondary battery be constructed by particles having a small particle size and narrow particle size distribution. This is because particles having a small particle size have a large specific surface area and not only can these particles sufficiently secure a reaction area with an electrolytic solution, but can also be used to make the positive electrode thin, and by shortening the moving distance between the positive electrode and the negative electrode, it is possible to reduce the positive electrode resistance. In addition, particles having a narrow particle size distribution are such that the voltage applied to each particle in the electrode is substantially constant, so it is possible to suppress a reduction in battery capacity due to selective deterioration of fine particles.

Here, in order to further improve the output characteristics, it is effective to form a space portion into which the electrolytic solution can penetrate inside the positive electrode active material for the nonaqueous electrolyte secondary battery. A positive electrode active material for a nonaqueous electrolyte secondary battery having a hollow structure constructed by an outer shell portion and a space portion provided inside the outer shell portion can make the reaction area with the electrolytic solution larger when compared to a positive electrode active material for a nonaqueous electrolyte secondary battery having a solid structure in which the size of the particles is about the same, so the positive electrode resistance can be greatly reduced.

It is known that the positive electrode active material for a nonaqueous electrolyte secondary battery inherits the particle properties of the transition metal-containing composite hydroxide that is the precursor thereof. Therefore, in order to obtain the above-described positive electrode active material for a nonaqueous electrolyte secondary battery, it is necessary to appropriately control the particle size, particle size distribution, particle structure, and the like of the transition metal-containing composite hydroxide that is the precursor thereof.

For example, JP 2012-246199 A, JP 2013-147416 A and WO 2012/131881 disclose a method of producing a transition metal-containing composite hydroxide as a precursor of a positive electrode active material by separating the crystallization reaction into two stages: a nucleation step in which mainly nucleation is performed and a particle growth step in which mainly particle growth is performed. In this method, by appropriately adjusting the pH value and the reaction atmosphere in the nucleation step and the particle growth step, a transition metal-containing composite hydroxide constructed by secondary particles having a small particle size and a narrow particle size distribution is obtained and includes a low density center portion composed only of fine primary particles, and a high-density outer shell portion composed only of plate-shaped primary particles.

A positive electrode active material for a nonaqueous electrolyte secondary battery obtained by using a transition metal-containing composite hydroxide having this kind of structure as a precursor has a small particle size and narrow particle size distribution as well as a hollow structure with an outer shell portion and a space portion provided inside the outer shell portion. Therefore, in secondary batteries using these positive electrode active materials for a nonaqueous electrolyte secondary battery, it is considered that the battery capacity, output characteristics, and cycle characteristics may be simultaneously improved.

Furthermore, JP 2011-119092 A discloses a lithium transition metal-containing composite oxide having a porous hollow structure for the purpose of displaying performance suitable for increasing output of a nonaqueous electrolyte secondary battery with little deterioration due to the charging and discharging cycle, and includes a space portion formed inside an outer shell portion of secondary particles formed of a collection of a plurality of primary particles, and through holes that penetrate from the outside to the space portion. With such a positive electrode active material having a porous hollow structure, it is considered that the positive electrode resistance is further reduced and the output characteristics are further improved.

PRIOR ART DOCUMENTS

Patent Literature

Patent Literature 1: JP 2012-246199 A
Patent Literature 2: JP 2013-147416 A
Patent Literature 3: WO 2012/131881
Patent Literature 4: JP 2011-119092 A

SUMMARY OF INVENTION

Technical Problem

On the premise of application to a power source of an electric vehicle or the like, further improvement of output characteristics required for a positive electrode active material for a nonaqueous electrolyte secondary battery without impairing the battery capacity and cycle characteristics is desired, and in order for that, it is necessary to further reduce the positive electrode resistance in the positive electrode active material for a nonaqueous electrolyte secondary battery.

In consideration of the problems described above, an object of the present invention is to provide a transition metal-containing composite hydroxide as a precursor of a positive electrode active material for a nonaqueous electrolyte secondary battery that, in the case of forming a secondary battery, has a structure capable of further improving output characteristics without impairing the battery capacity and cycle characteristics of the secondary battery. Moreover, another object of the present invention is to provide a method for efficiently producing on an industrial scale a positive electrode active material and a transition metal-containing composite hydroxide having such a structure.

Solution to Problem

A first aspect of the present invention relates to a transition metal-containing composite hydroxide that is used as a precursor of positive electrode active material for a nonaqueous electrolyte secondary battery. Particularly, the transition metal-containing composite hydroxide of the present invention comprises secondary particles formed by aggregates of a plurality of plate-shaped primary particles and a plurality of fine primary particles having a smaller particle size than the plate-shaped primary particles; the secondary particles including: a center portion constructed by the fine primary particles; and an outer-shell portion having a high-density layer formed on the outside of the center portion and constructed by the plate-shaped primary particles; a low-density layer formed on the outside of the high-density layer and constructed by the fine primary particles, and an outer-shell layer formed on the outside of the low-density layer and constructed by the plate-shaped primary particles.

More specifically, in the case where the secondary particles include the center portion, and the outer-shell portion having the high-density layer, the low-density layer and the outer-shell layer; preferably the average ratio of the outer diameter of the center portion with respect to the particle size of the secondary particles is within a range of 35% to 85%, and the average ratio of the sum of the thicknesses of the high-density layer and the outer shell layer with respect to the particle size of the secondary particles is within a range of 5% to 30%. In this case, preferably the average ratio of the thickness of the low-density layer with respect to the particle size of the secondary particles is within a range of 2% to 20%. Note that preferably the ratio of respective thicknesses of the high-density layer and the outer-shell layer is within a range of 2.5% to 15%.

The transition metal-containing composite hydroxide of the present invention is not limited to the above structure and may also be configured such that the outer-shell portion includes: the high-density layer, the low-density layer, a second high-density layer that is formed on the outside of the low-density layer and constructed by the plate-shaped primary particles, a second low-density layer that is formed on the outside of the second high-density layer and constructed by the fine primary particles, and the outer-shell layer that is formed on the outside of the second low-density layer.

Preferably, in the case where the secondary particles are configured by the center portion, and the outer-sell portion having the high-density layer (first high-density layer), the low-density layer (first low-density layer), the second high density layer, the second low-density layer and the outer-shell layer, the average ratio of the outer diameter of the center portion with respect to the particle size of the secondary particles is in within a range of 35% to 80%, and the average ratio of the sum of the thicknesses of the first high-density layer, the second high-density layer, and the outer-shell layer with respect to the particle size of the secondary particles is within a range of 8% to 30%. In this case, preferably the average ratio of the sum of the thicknesses of the first low-density layer and the second low-density layer with respect to the particle size of the secondary particles is within a range of 2% to 20%. Note that, preferably the ratio of the respective thicknesses of the first high-density layer, the second high-density layer, and the outer-shell layer with respect to the particle size of the secondary particles is 2.5% to 15%. Preferably the ratio of the respective thicknesses of the first low-density layer and the second low-density layer with respect to the particle size of the secondary particles is within a range of 1.0% to 10%.

Preferably, the average particle size of the plate-shaped primary particles is within a range of 0.3 µm to 3 µm, and the average primary particle size of the fine primary particles is smaller than the average particle size of the plate-shaped primary particles and is within a range of 0.01 µm to 0.3 µm.

Moreover, preferably the average particle size of the secondary particles is within a range of 1 µm to 15 µm, and the value of [(d90−d10)/average particle size] as an index indicating the spread of the particle size distribution of the secondary particles is 0.65 or less.

The composition of the transition metal-containing composite hydroxide of the present invention is not necessarily limited, however, the present invention may be suitably applied to a transition metal-containing composite hydroxide that is represented by a general formula (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element selected from Mg, Ca, Al, Ti, V, Cr, Zr, Nb, Mo, Hf, Ta, and W.

In this case, the additional element M can adopt various existence forms within the secondary particles as long as the composition ratio is within the above range. For example, preferably the additional element M exists in a form that is uniformly distributed inside the secondary particles, and/or a surface of the secondary particles is coated by a compound that includes the additional element M.

A second aspect of the present invention relates to a method for producing the above-described transition metal-containing composite hydroxide by mixing a raw material aqueous solution including at least a transition metal element and an aqueous solution including an ammonium ion donor to form a reaction aqueous solution, and performing a crystallization reaction. Particularly, the method for producing the transition metal-containing composite hydroxide of the present invention includes:

a nucleation step in which the pH value of the reaction aqueous solution at a standard liquid temperature of 25° C. is adjusted to be within a range of 12.0 to 14.0, and an oxygen atmosphere where the oxygen concentration exceeds 5% by volume is maintained, to create nuclei; and a particle growth step in which the pH value of the reaction aqueous solution including the nuclei obtained in the nucleation step at a standard liquid temperature 25° C. is adjusted to be lower than the pH value of the nucleation step and to be within a range of 10.5 to 12.0 to cause to growth of the nuclei; and the particle growth step being provided with: a first stage of maintaining the oxidizing atmosphere from the start of the particle growth step; a second stage after the first stage of switching from the oxidizing atmosphere to a non-oxidizing atmosphere in which the oxygen concentration is 5% by volume or less, and maintaining the non-oxidizing atmosphere; a third stage after the second stage of switching from the non-oxidizing atmosphere to the oxidizing atmosphere, and maintaining the oxidizing atmosphere; and a fourth stage after the third stage of switching from the oxidizing atmosphere to the non-oxidizing atmosphere, and maintaining the non-oxidizing atmosphere.

Preferably, the time of the first stage is within a range of 0.5% to 20% with respect to the total time of the particle growth step; the time of the second stage is within a range of 10% to 80% with respect to the total time of the particle growth step; the time of the third stage is within a range of 2% to 30% with respect to the total time of the particle growth step; and the time of the fourth stage is within a range of 10% to 80% with respect to the total time of the particle growth step.

In the method for producing the transition metal-containing composite hydroxide of the present invention, a fifth stage after the fourth stage of switching from the non-oxidizing atmosphere to the oxidizing atmosphere, and maintaining the oxidizing atmosphere; and a sixth stage after the fifth stage of switching from the oxidizing atmosphere to the non-oxidizing atmosphere, and maintaining the non-oxidizing atmosphere may also be provided.

In this case, preferably the time of the first stage is within a range of 0.5% to 20% with respect to the total time of the particle growth step; the time of the second stage is within a range of 10% to 75% with respect to the total time of the particle growth step; the time of the third stage is within a range of 2% to 30% with respect to the total time of the particle growth step; the time of the fourth stage is within a range of 10% to 75% with respect to the total time of the particle growth step; the time of the fifth stage is within a range of 2% to 30% with respect to the total time of the particle growth step; and the time of the sixth stage is within a range of 10% to 75% with respect to the total time of the particle growth step.

In the method of producing the transition metal-containing composite hydroxide of the present invention as well, the composition of the transition metal-containing composite hydroxide obtained is not necessarily limited, however, preferably the composition of the transition metal-containing composite hydroxide is represented by a general formula (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element selected from Mg, Ca, Al, Ti, V, Cr, Zr, Nb, Mo, Hf, Ta, and W.

Incidentally, after the particle growth step, a coating step may be provided for coating the surface of the transition metal-containing composite hydroxide with a compound that includes the additional element M.

A third aspect of the present invention relates to a method of producing a positive electrode active material for a nonaqueous electrolyte secondary battery used as the positive electrode material of a nonaqueous electrolyte secondary battery and constructed by a lithium transition metal-containing composite oxide constructed by secondary particles formed by aggregates of a plurality of primary particles. Particularly, the method for producing the positive electrode active material for a nonaqueous electrolyte secondary battery of the present invention includes:

a mixing step of mixing the transition metal-containing composite hydroxide according to the first aspect of the present invention with a lithium compound to form a lithium mixture; and a firing step of firing the lithium mixture in an oxidizing atmosphere at a temperature within a range of 650° C. to 1000° C. to obtain a positive electrode active material for a nonaqueous electrolyte secondary battery comprising a lithium transition metal-containing composite oxide.

In the mixing step, preferably the mixing amount of the lithium compound is adjusted so that the ratio of the number of atoms of lithium included in the lithium mixture with respect to the total number of atoms of the metal elements other than lithium is within a range of 0.95 to 1.5.

Moreover, preferably, before the mixing step, a heat treatment step is further provided for heat treating the transition metal composite hydroxide at a temperature within a range of 105° C. to 750° C.

In the method of producing the positive electrode active material for a nonaqueous electrolyte secondary battery of the present invention, the composition of the positive electrode active material for a nonaqueous electrolyte secondary battery is not necessarily limited, and preferably the composition of this positive electrode active material for a nonaqueous electrolyte secondary battery is represented by a general formula (B): $Li_{1+u}Ni_xMn_yCo_zM_tO_2$, where $-0.05 \leq u \leq 0.50$, $x+y+z+t=1$, $0.3 \leq x \leq 0.95$, $0.05 \leq y \leq 0.55$, $0 \leq z \leq 0.4$, $0 \leq t \leq 0.1$, and M is at least one or more additional element selected from among Mg, Ca, Al, Ti, V, Cr, Zr, Nb, Mo, Hf, Ta, and W.

Advantageous Effects

By using the positive electrode active material for a nonaqueous electrolyte secondary battery as a positive electrode material, the positive electrode active material obtained by using the transition metal-containing composite hydroxide of the present invention as a precursor, it is possible to provide a nonaqueous electrolyte secondary battery that further improves the output characteristics without impairing the battery capacity and cycle characteristics as compared with a nonaqueous electrolyte secondary battery that uses a conventional positive electrode active material having a hollow structure or a porous hollow structure as a positive electrode material. Moreover, with the present invention, it is possible to provide a positive electrode active material for a nonaqueous electrolyte secondary battery that contribute to improvement of such battery characteristics and a transition metal-containing composite hydroxide as a precursor thereof in production on an industrial scale with high production efficiency. Therefore, the present invention has extremely large industrial significance.

MODE FOR CARRYING OUT INVENTION

Figure 1:
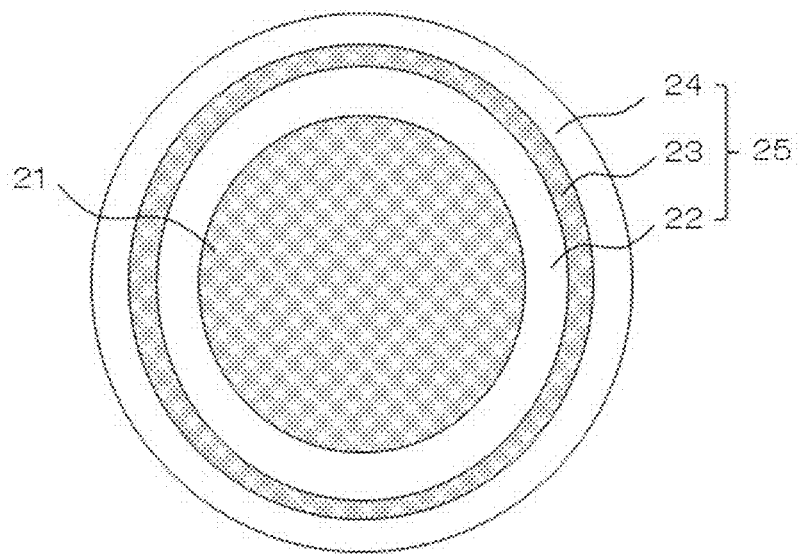
FIG. 1 is a cross-sectional view schematically illustrating the structure of a transition metal-containing composite hydroxide of the present invention.

The inventors of the present invention diligently performed investigation in order to further improve the output characteristics of the positive electrode active material for a nonaqueous electrolyte secondary battery (hereinafter referred to as "positive electrode active material") obtained based on conventional techniques such as described in WO 2004/181891 and JP 2011-110992 A having a small particle size and narrow particle size distribution, and having a hollow structure or a porous hollow structure with an outer shell portion and a space portion on the inner side of the outer shell.

As a result, the inventors found that in the positive electrode active material, by providing a through hole in the outer-shell portion that penetrate to the space portion, not only does it become possible for the electrolytic solution to sufficiently penetrate into the space portion existing inside the positive electrode active material, but it is also possible for a conductive aid to penetrate into the space portion through the through hole, so it becomes possible to positively utilize the inner and outer surfaces of the secondary particles of the positive electrode active material as a reaction field with the electrolytic solution, and the positive electrode resistance of the positive electrode active material can be sufficiently lowered.

In order to obtain a positive electrode active material with this kind of structure, the inventors found that by making the structure of the secondary particles of the transition metal-containing composite hydroxide (hereinafter referred to as "composite hydroxide") such as to include a center portion constructed by fine primary particles; and an outer-shell portion that is formed on the outside of the center portion and having a high-density layer constructed by the plate-shaped primary particles, a low-density layer that is formed on the outside of the high-density layer and that is constructed by the fine primary particles, and an outer-shell layer that is formed on the outside of the low-density layer and that is constructed by the plate-shaped primary particles, in other words, by making the structure a three-layer structure in which the portion that forms the outer shell portion of the positive electrode active material by firing is provided with a low-density layer having a specified thickness in the radial direction and constructed by fine primary particles being sandwiched in a middle portion in the radial direction between a high-density layer and an outer-shell layer constructed by plate-shaped primary particles, instead of making it just a single high-density layer of plate-shaped primary particle, it is possible due to the low density layer to form a through hole that enables not only the electrolytic solution but also the conductive aid to penetrate through the outer shell portion of the positive electrode active material.

Furthermore, it was found that in order to obtain a composite hydroxide comprising secondary particles having such a structure, in a particle-growth process, by switching the reaction atmosphere in a short time by supplying atmospheric gas to the reaction system while continuing the supply of raw material aqueous solution, it is possible to alternately layer a high-density layer constructed by plate-shaped primary particles and a low-density layer constructed by fine primary particles.

In addition, the inventors found that by using a composite hydroxide having such a structure as a precursor, the positive electrode active material includes secondary particles having a small particle size, a narrow particle size distribution, high sphericity and excellent filling characteristic.

The present invention has been completed based on these findings.

1. Transition Metal-Containing Composite Hydroxide
(1-1) Structure of Transition Metal-Containing Composite Hydroxide The composite hydroxide of the present invention is a precursor of a positive electrode active material for a nonaqueous electrolyte secondary battery comprises secondary particles that are formed by an aggregate of a plurality of plate-shaped primary particles and a plurality of fine primary particles having a smaller particle size than the plate-shaped primary particles.

Particularly, as illustrated in FIG. 1, secondary particles of the composite hydroxide of the present invention have a center portion (21) constructed by fine primary particles, and an outer-shell portion (25) that includes: a high-density layer (22) formed on the outer side of the center portion and constructed by plate-shaped primary particles, a low-density layer (23) formed on the outside of the high-density layer and constructed by fine primary particles, and an outer-shell layer (24) formed on the outside of the low-density layer and constructed by the plate-shaped primary particles. In other words, the secondary particles have a structure that includes a center portion and an outer-shell portion, and the outer-shell portion further has a three-layer structure that includes a high-density layer, a low-density layer and an outer-shell layer.

In the composite hydroxide of the present invention, the outer-shell portion can be such that in addition to the structure in which one layer each of a high-density layer and a low-density layer are layered inside the outer shell layer, a structure may also be employed in which two layers each of a high-density layer and a low-density layer are layered inside the outer shell layer. In other words, the entire outer-shell portion may have a five-layer layered structure in which inside the outer shell layer layer, a layered structure, which includes a second high-density layer constructed by the plate-shaped primary particles and a second low-density layer constructed by the fine primary particles formed on the outside of the second high-density layer, is formed on the outside of a layered structure, which includes the high-density layer (first high-density layer) and the low-density layer (second low-density layer).

First, since the center portion has a structure in which there is a series of many gaps among the fine primary particles, when compared with the high-density layer or outer-shell layer composed of larger and thick plate-shaped primary particles, sintering of the center portion proceeds from a low-temperature region during firing for forming the composite hydroxide into positive electrode active material, so shrinking of the center portion occurs on the high-density layer side where sintering proceeds slowly from the center of the particles, causing space to occur in the center portion. In this way, since the center portion has a low density and the shrinkage ratio is large, the center portion becomes a space having a sufficient size. Therefore, the positive electrode active material obtained after the firing has a hollow structure comprising the outer-shell portion and a space portion located on the inside of the outer-shell portion.

Particularly, the secondary particles of the composite hydroxide of the present invention is not provided with an outer-shell portion that includes only one high-density layer around the center portion as in the conventional structure, but is proved with an outer-shell portion that has a layered structure in which a low-density layer having a specific thickness in the radial direction is sandwiched in between a high-density layer and an outer-shell layer.

With this kind of configuration, at the time of firing, a structural portion having many gaps among the fine primary particles of the low-density layer shrinks toward the high-density layer and the outer-shell layer, thereby forming a space portion, however, this space portion does not have a radial thickness sufficient to maintain the shape. Therefore, as the high-density layer and the outer-shell layer are sintered, they are substantially integrated while absorbing the low-density portion to form one outer-shell portion, however, at this time, the volume of the low-density portion that is absorbed is insufficient, so it is thought that by the high-density layer and the outer shell layer shrinking during firing, a through hole having a sufficient size is formed that penetrate the integrated outer-shell portion from the outside to the inside.

Here, the low-density layer may include plate-shaped primary particles, and by including plate-shaped primary particles, it becomes easy for the integration of the high-density layer and the outer-shell layer to proceed. On the other hand, when there are too many plate-shaped primary particles, shrinkage of the low-density layer is reduced. Therefore, even in the case where the low-density layer includes plate-shaped primary particles, the proportion of the plate-shaped primary particles present is preferably 50% or less in the cross-sectional area of the low-density layer.

Moreover, in the secondary particles of the composite hydroxide, the low-density layer does not need to be formed around the entire circumferential direction of the secondary particles between the high-density layer and the outer-shell layer, and a structure in which there is at least one through hole of a sufficient size in the outer-shell portion of the positive electrode active material and this kind of a low-density layer is partially formed is also included within the range of the present invention.

In the secondary particles of the positive electrode active material obtained as the precursor of the composite hydroxide of the present invention, electrical conduction of the entire outer-shell portion is ensured, and by the through hole formed in the outer-shell portion having a specific length and inner diameter, it is possible for not only the electrolytic solution but also the conductive aid to penetrate sufficiently through the through hole into the space existing on the inside of the outer-shell portion. Therefore, it is possible to positively utilize the inner and outer surfaces of the secondary particles (outer-shell portion) as a reaction field with the electrolytic solution, and it is possible to greatly reduce the internal resistance of the positive electrode active material.

(1-2) Average Particle Size of Transition Metal-Containing Composite Hydroxide

The average particle size of the secondary particles of the composite hydroxide of the present invention is adjusted to 1 μm to 15 μm, and preferably 3 μm to 12 μm, and more preferably 3 μm to 10 μm. The average particle size of the positive electrode active material correlates with the average particle size of the precursor composite hydroxide. Therefore, by setting the average particle size of the composite hydroxide in such a range, it is possible to set the average particle size of the positive electrode active material within a predetermined range.

Incidentally, in the present invention, the average particle size of the composite hydroxide means the mean volume particle size (MV) and can be obtained by a laser beam diffraction scattering type particle size analyzer.

(1-3) Particle Size Distribution of Transition Metal-Containing Composite Hydroxide The value of [(d90−d10)/average particle size], which is an index indicating the spread of the particle size distribution of the secondary particles of the composite hydroxide of the present invention, is adjusted to 0.65 or less, and preferably 0.55 or less, and more preferably 0.50 or less.

The particle size distribution of the positive electrode active material is strongly influenced by the precursor composite hydroxide as the precursor. Therefore, for example, in the case where a positive electrode active material is prepared using a composite hydroxide including a large amount of fine particles or coarse particles as the precursor, fine particles and coarse particles are also included in the positive electrode active material, which makes it impossible to sufficiently improve the safety, cycling characteristics and output characteristics of the secondary battery that uses this positive electrode active material. Therefore, by adjusting the particle size distribution of the precursor composite hydroxide so that the value of [(d90−d10)/average particle size] is 0.65 or less, the particle size distribution of the positive electrode active material can be narrowed, and it is possible to avoid the problems related to the above-described battery characteristics, and particularly safety and cycling characteristics caused by selective deterioration of fine particles. However, in the case of considering production on an industrial scale, preparing a composite hydroxide in a powder state in which the value of [(d90−d10)/average particle size] is excessively small is not practical from the aspect of yield, productivity, or production cost. Therefore, the lower limit value of the value of [(d90−d10)/average particle size] is preferably about 0.25.

Here, d10 means the particle size at which the number of particles at each particle size of powder samples are accumulated from the side of smaller particle size, and the cumulative volume thereof is 10% of the total volume of all particles, and d90 means the particle size at which the cumulative volume becomes 90% of the total volume of all particles when the number of particles is accumulated by the same method. In the same way as finding the average particle size of the composite hydroxide, d10 and d90 can be obtained from the volume integrated value measured using a laser beam diffraction scattering type particle size analyzer.

(1-4) Thickness of Center Portion, High-Density Layer, Low-Density Layer and Outer-Shell Layer In the composite hydroxide of the present invention, the ratio of the outer diameter of the center portion to the particle size of the secondary particles, and the ratio of the total thickness of the high-density layer and the outer-shell layer that form the outer-shell portion in the positive electrode active material to the particle size of the secondary particles hardly change even in the positive electrode active material that is obtained using these secondary particles as a precursor. Therefore, in the secondary particles of the composite hydroxide, by appropriately controlling the outer diameter of the center portion with respect to the particle size and the ratio of the respective thicknesses of the high-density layer, the low-density layer and the outer-shell layer to the particle size of the secondary particles, it is possible to set the particle structure of the positive electrode active material within an appropriate range.

[Case of the Outer-Shell Portion Having a Three-Layer Structure]

In the case where the outer-shell portion of the composite hydroxide has only one laminated structure constructed by the high-density layer and the low-density layer on the inner side of the outer-shell layer, or in other words, in the case of having a three layer structure, in the secondary particles of the composite hydroxide, the average ratio of the outer diameter of the center portion to the particle size (hereinafter referred to as "center portion ratio to particle size") is preferably in the range of 35% to 85%, and more preferably in the range of 40% to 80%, and even more preferably in the range of 55% to 75%. With such a configuration, in the positive electrode active material, a space having a sufficient size can be formed inside the secondary particles, and the surface area inside the outer-shell portion of the secondary particles can be secured. In addition, in the composite hydroxide, the high-density layer, the low-density layer, and the outer-shell layer of the outer-shell portion are set to an appropriate thickness, and in the positive electrode active material obtained using such a composite hydroxide as a precursor, it is possible to form an outer-shell portion having an appropriate thickness and in which a specified through hole is present that penetrates in the radial direction.

In addition, in the secondary particles of the composite hydroxide, the average ratio of the total of the thicknesses of the high-density layer and the outer-shell layer of the outer-shell portion of the composite hydroxide to the particle size of the secondary particles (hereinafter, referred to as "total high-density layer ratio to particle size) is preferably within the range of 5% to 30%, and more preferably within the range of 8% to 25%, and even more preferably within the range of 10% to 20%. By setting the total high-density layer ratio to particle size within this range, it becomes possible to form a low-density layer having a specified size, and in addition, excess volume shrinkage of the high-density layer and the outer-shell layer at the time of firing for preparing the positive electrode active material can be suppressed, and it becomes possible to form an outer-shell portion having an appropriate thickness in the positive electrode active material.

The ratio of the thickness of the high-density layer with respect to the particle size of the secondary particles (hereinafter referred to as "high-density layer ratio to particle size") is preferably within the range of 2.5% to 15%, and more preferably within the range of 3% to 15%, and even more preferably within the range of 3% to 10%. When the high-density layer ratio to particle size is less than 2.5%, there is a possibility that it may become impossible to form a through hole due to shrinkage at the time of integration with the outer-shell layer during firing of the composite hydroxide, or conversely that the form will collapse. On the other hand, in the case where the high-density layer ratio to particle size exceeds 15%, there is a possibility that it will become impossible to form a sufficient low-density layer between the high-density layer and the outer-shell layer, or it may become impossible to form an outer-shell layer having sufficient thickness, and furthermore, there is a possibility that during firing of the composite hydroxide, shrinkage of the high-density layer will be insufficient to form a through hole, and that a space portion will remain between the high-density layer and the outer-shell layer, and in these cases, in the obtained positive electrode active material, a desired structure that includes an outer-shell portion provided with a through hole penetrating in the radial direction and a space portion on the inner side of the outer-shell portion may not be obtained.

The ratio of the thickness of the outer-shell layer with respect to the particle size of the secondary particles (hereinafter referred to as "outer-shell layer ratio to particle size") is also preferably within the range of 2.5% to 15%, and more preferably within the range of 2.5% to 12%, and more preferably within the range of 2.5% to 10%. By setting the outer-shell layer ratio to particle size within this range, it is possible to appropriately control the shape and average particle size of the secondary particles in the positive electrode active material, and to form an outer-shell portion having an appropriate thickness. In the case where the outer-shell layer ratio to particle size is less than 2.5%, its form may collapse during firing of the composite hydroxide. On the other hand, in the case where the outer-shell layer ratio to particle size exceeds 15%, a sufficient low-density layer cannot be formed between the high-density layer and the outer-shell layer, or a high-density layer having a sufficient thickness cannot be formed, and furthermore there is a possibility that a through hole cannot be formed during firing of the composite hydroxide and the space portion may remain between the high-density layer and the outer-shell portion, and in these cases, the desired structure for the positive electrode active material cannot be obtained.

On the other hand, the ratio of the thickness of the low-density layer with respect to the particle size of the secondary particles (hereinafter referred to as "low-density layer ratio to particle size") is preferably within the range of 2% to 20%, and more preferably within the range of 2% to 10%, and more preferably within the range of 2% to 8%. By setting the low-density layer ratio to particle size within this range, it becomes possible to form an outer-shell portion having an appropriate thickness and a through hole having an appropriate size in the positive electrode active material. When the low-density layer ratio to particle size is less than 2%, voids that are large enough to form a specified through hole in the outer-shell portion of the positive electrode active material do not occur at the time of firing of the composite hydroxide. Conversely, in the case where the low-density layer ratio to particle size exceeds 20%, a space portion is formed between the high-density layer and the outer-shell layer at the time of firing the composite hydroxide, and the high-density layer and the outer-shell portion is not substantially integrated, so a desired structure cannot be obtained for the positive electrode active material that is obtained.

Here, the center portion ratio to particle size, the total high-density layer ratio to particle size, the high-density layer ratio to particle size, the outer-shell layer ratio to particle size, and the low-density layer ratio to particle size can be found by observing the cross section of the composite hydroxide using a scanning electron microscope (SEM) such as a field emission scanning electron microscope (FE-SEM) or the like. More specifically, first, the cross section of the secondary particles is observed in a field of view in which it is possible to distinguish between the center portion, the high-density layer, the low-density layer, and the outer-shell layer in the secondary particles.

The maximum length between two arbitrary points on the outer edge of the secondary particle and the maximum length between two arbitrary points on the outer edge of the center portion are both measured and these values are respectively referred to as the particle size of the secondary particles and the outer diameter of the center portion. Moreover, the thicknesses of the high-density layer, the low-density layer, and the outer-shell layer at three or more arbitrary locations with respect to one secondary particle are measured, and the average value is obtained. Here, the thickness of the high-density layer is set as the length between two points obtained by selecting an arbitrary point from the innermost edge of the high-density layer in the cross section of the secondary particle and a point on the boundary between the high-density layer and the low-density layer where the length from the arbitrary point is the shortest. Moreover, similarly, the thickness of the low-density layer is set as the length between two points obtained by selecting an arbitrary point from the innermost edge of the low-density layer in the cross section of the secondary particle and a point on the boundary between the low-density layer and the outer-shell layer where the length from the arbitrary point is the shortest. Furthermore, the thickness of the outer-shell layer is likewise set as the length between two points obtained by selecting an arbitrary point from the innermost edge of the outer-shell layer in the cross section of the secondary particle and a point on the outer edge of the secondary particle where the length from the arbitrary point is the shortest.

By dividing the outer diameter of the center portion, the thickness of the high-density layer, the thickness of the low-density layer, and the thickness of the outer-shell layer by the particle size of the secondary particles of the composite hydroxide, the center portion ratio to particle size, high-density layer ratio to particle size, low-density layer ratio to particle size, and outer-shell layer ratio to particle size are determined, respectively. By performing the same measurement for 10 or more composite hydroxides and calculating the average value by the number thereof, the center portion ratio to particle size, high-density layer ratio to particle size, low-density layer ratio to particle size, and outer-shell layer ratio to particle size are finally determined for the entire test sample. It should be noted that the total high-density layer ratio to particle size can be obtained from the finally obtained high-density layer ratio to particle size and outer-shell layer ratio to particle size.

[Case of the Outer-Shell Portion Having a Five-Layer Structure]

In the case where the outer-shell portion of the composite hydroxide has a structure having two lamination layers, each of which is provided with a high-density layer and a low-density layer, on the inner side of the outer-shell layer, or in other words, in the case of five-layer structure constructed by a first-high density layer, a first low density layer, a second high-density layer, a second low-density layer, and an outer-shell layer, the center portion ratio to particle size is preferably within the range of 35% to 80%, and more preferably within the range of 40% to 75%, and even more preferably within the range of 55% to 75%.

The ratio of the high-density layer to the particle size, which is the average ratio of the sum of the thicknesses of the first high-density layer, the second high-density layer, and the outer-shell layer with respect to the particle size of the secondary particles, is preferably within the range 8% to 30%, and more preferably within the range of 8% to 25%, and even more preferably within the range of 10% to 25%.

The ratio of the high-density layer to the particle size, which is the average ratio of the thickness per each high-density layer with respect to the particle size of the secondary particles, is preferably within the range of 2.5% to 15%, and more preferably within the range 3% to 12%, and even more preferably within the range 3% to 10%.

Similarly, the ratio of the outer-shell layer to the particle size is preferably within the range of 2.5% to 15%, and more preferably within the range of 3% to 12%, and even more preferably within the range of 3% to 10%.

The ratio of the total particle size of the low-density layer to the particle size, which is the average ratio of the sum of the thicknesses of the first low-density layer and the second low-density layer with respect to the particle size of the secondary particles, is preferably within the range of 2% to 20%, and more preferably within the range of 3% to 15%, and even more preferably within the range of 3% to 10%. The ratio of the low-density layer to the particle size, which is the average ratio of the thickness of each low-density layer with respect to the particle size of the secondary particles, is preferably within the range of 1% to 10%, and more preferably within the range of 2% to 7%.

In the present invention, even when the outer-shell portion has a structure having two or more lamination layers, each of which is provided with a high-density layer and a low-density layer, on the inner side of the outer-shell layer, basically, when firing a composite hydroxide having such a structure, the first high-density layer, the second high-density layer, and the outer-shell layer are substantially integrated by sintering shrinkage. In this case, a structure of an outer-shell portion provided with a specified through hole allowing entry of the electrolytic solution and the conductive aid into the space portion can be obtained while maintaining the durability of the whole positive electrode active material, and it is possible to further reduce the positive electrode resistance.

(1-5) Primary Particles

In the composite hydroxide of the present invention, the average particle size of the fine primary particles, which are the constituent elements of the center portion and the low-density layer is preferably within the range of 0.01 μm to 0.3 μm, and more preferably within the range of 0.1 μm to 0.3 μm. When the average particle size of the fine primary particles is less than 0.01 μm, the thickness of the low-density layer may not be satisfactorily obtained in some cases. On the other hand, when the average particle size of the fine primary particles is larger than 0.3 μm, in the firing step for preparing the positive electrode active material, the volumetric shrinkage due to heating does not sufficiently proceed at the time of firing in the low-temperature region, and the difference in the volumetric shrinkage amounts between the center portion and the low-density layer, and the high-density layer and the outer-shell layer becomes small, so a center portion having a sufficiently large void at the center of the secondary particles of the positive electrode active material may not be formed, or, a sufficiently large through hole that connects the center portions with the outside of the secondary particles may not be formed in the outer-shell portion of the secondary particles of the positive electrode active material.

The shape of such fine primary particles is preferably needle-shaped. Needle-shaped primary particles have a shape having one-dimensional directionality, and when the particles aggregate, a structure with many gaps, or in other words, a structure with low density is formed. As a result, it is possible to sufficiently increase the density difference between the center portion and the low-density layer, and the high-density layer and the outer-shell layer.

The plate-shaped primary particles forming the high-density layer and the outer-shell layer of the secondary particles of the composite hydroxide preferably have an average particle size within the range of 0.3 µm to 3 µm, and more preferably within the range of 0.4 µm to 1.5 µm, and even more preferably within the range of 0.4 µm to 1.0 µm. When the average particle size of the plate-shaped particles is less than 0.3 µm, volumetric shrinkage of the plate-shaped primary particles also occurs in the low-temperature region in the firing step for preparing the positive electrode active material, so the difference in volume shrinkage between the high-density layer and the outer shell layer, and the center portion and the low-density layer becomes small, and thus sufficient hollow structure may not be obtained in the positive electrode active material, or a sufficient amount of absorption of the low density layer leading to the formation of the through hole in the outer-shell portion of the positive electrode active material may not be obtained. On the other hand, when the average primary particle size of the plate-shape primary particles is larger than 3 µm, in the firing step of preparing the positive electrode active material, it is necessary to perform firing at a higher temperature in order to increase the crystallinity of the positive electrode active material, and sintering between the secondary particles of the composite hydroxide progresses making it difficult to set the average particle size and particle size distribution of the positive electrode active material within a specified range.

In the case where the fine primary particles include needle-shaped primary particles, the difference in the average particle size between the fine primary particles and the plate-shaped primary particles is preferably 0.1 µm or more, more preferably 0.2 µm or more. Moreover, in the case where the fine primary particles have another structure, for example, a structure similar to that of plate-shaped primary particles, the difference in average particle size between the fine primary particles and the plate-shaped primary particles is preferably 0.2 µm or more, and more preferably 0.3 µm or more.

Furthermore, the average primary particle size of the fine primary particles and the plate-shaped primary particles can be determined by embedding the composite hydroxide in a resin or the like, and after making the cross section observable by cross section polisher processing or the like, making observations using an electric field type scanning electron microscope (FE-SEM), and obtain the result as follows. First, the maximum outer diameters (major-axis diameters) of 10 or more fine primary particles or plate-shaped primary particles present in the cross section of a secondary particle of the composite hydroxide are measured and the average value for the number of particles thereof is determined, and that value is defined as the particle size of the fine primary particles or plate-shaped primary particles in the secondary particle. Next, for 10 or more secondary particles, the particle size of the fine primary particles and the plate-like primary particles is similarly found. Finally, by determining the number average of the particle sizes obtained for these secondary particles, the average particle size of the fine primary particles or the plate-shaped primary particles of the whole composite hydroxide including these secondary particles is determined.

(1-6) Composition of Transition Metal-Containing Composite Hydroxide

A feature of the composite hydroxide of the present invention is the particle structure of the secondary particles, so the composition of the composite hydroxide to which the present invention is applied is not limited. However, the present invention may be suitable applied to a compound represented by the general formula (A): $Ni_xMn_yCo_zM_t(OH)_{2+a}$, where, $x+y+z+t=1$, $0.3 \le x \le 0.95$, $0.05 \le y \le 0.55$, $0 \le z \le 0.4$, $0 \le t \le 0.1$, $0 \le a \le 0.5$, and M is one or more kind of additional element selected from among Mg, Ca, Al, Ti, V, Cr, Zr, Nb, Mo, Hf, Ta, and W. By using a complex hydroxide having this kind of composition as a precursor, it is possible to easily obtain a positive electrode active material that can achieve higher battery performance and that is represented by the composition of a general formula (B).

In composite hydroxide having this kind of composition, the additional element M is crystallized together with transition metals (nickel, cobalt, and manganese) by a crystallization reaction, and can be uniformly distributed in the secondary particles of the composite hydroxide, however, after the crystallization reaction, the outermost surface of the secondary particles of the composite hydroxide may be covered with a compound mainly including the additional element M. In addition, in the mixing step, when preparing the positive electrode active material, it is also possible to mix a compound including the additional element M together with a lithium compound into the composite hydroxide. Moreover, these methods may be used in combination. Regardless of the method used, it is necessary to adjust the content of the additional element M in the composite hydroxide so that the positive electrode active material finally has the composition represented by the general formula (B).

Incidentally, in the complex hydroxide represented by the general formula (A), the composition ranges and the critical significance thereof of nickel, manganese, cobalt and the additional element M of the complex hydroxide are the same as the positive electrode active material represented by the general formula (B). Therefore, an explanation of these will be omitted here.

2. Method for Producing Transition Metal-Containing Composite Hydroxide (2-1) Aqueous Solution Supply In the method for producing a complex hydroxide of the present invention, a raw material aqueous solution including at least a transition metal, preferably nickel, nickel and manganese, or nickel, manganese and cobalt, and an aqueous solution including a complexing agent are supplied to form a reaction aqueous solution, and while adjusting the pH value of the aqueous reaction solution to a predetermined range with a pH adjusting agent, a complex hydroxide is obtained by a crystallization reaction.

a) Raw Material Aqueous Solution

In the present invention, the ratio of the metal element included in the raw material aqueous solution is essentially the same as the composition of the composite hydroxide that will be obtained. Therefore, it is necessary that the content of each metal component of the raw aqueous solution be appropriately adjusted according to the composition of the desired composite hydroxide. For example, in the case of obtaining a composite hydroxide having the composition represented by the general formula (A), it is necessary to adjust the ratio of the metal elements in the aqueous solution to be Ni:Mn:Co:M=x:y:z; t, where, x+y+z+t=1, $0.3 \leq x \leq 0.95$, $0.05 \leq y \leq 0.55$, $0 \leq z \leq 0.4$, $0 \leq t \leq 0.1$. However, when the additional element M is introduced in a separate step as described above, the additional element M is not included in the raw material aqueous solution. Moreover, in the nucleation step and the particle growth step, it is also possible to change whether or not an additional element M is added, or it is possible to change the content ratio of the transition metals and the additional element M.

The transition metal compound for preparing the raw material aqueous solution is not particularly limited, however, from the aspect of ease of handling, it is preferable to use water-soluble nitrate, sulfate, hydrochloride, or the like, and from the aspect of raw material cost and preventing contamination of halogen components, it is particularly preferable to use a sulfate.

Moreover, in the case where an additional element M (M is one or more kind of additional element selected from among Mg, Ca, Al, Ti, V, Cr, Zr, Nb, Mo, Hf, Ta, and W) is included in the composite hydroxide, preferably a water-soluble compound is similarly used as a compound for supplying the additional element M, and for example, magnesium sulfate, calcium sulfate, aluminum sulfate, titanium sulfate, ammonium peroxotitanate, potassium titanium oxalate, vanadium sulfate, ammonium vanadate, chromium sulfate, potassium chromate, zirconium sulfate, niobium oxalate, ammonium molybdate, hafnium sulfate, sodium tantalate, sodium tungstate, ammonium tungstate and the like can be suitably used.

The concentration of the raw material aqueous solution is determined based on the total material amount of the metal compound, and is preferably 1 mol/L to 2.6 mol/L, and more preferably 1.5 mol/L to 2.2 mol/L. When the concentration of the raw material aqueous solution is less than 1 mol/L, the amount of crystallization per volume of the reaction tank decreases, so productivity decreases. On the other hand, when the concentration of the mixed aqueous solution exceeds 2.6 mol/L, the saturation concentration at room temperature is exceeded, so crystals of the respective metal compounds may be reprecipitated and clog the piping and the like.

The above-described metal compound is not necessarily supplied to the reaction tank as a raw material aqueous solution. For example, in the case where a crystallization reaction is performed using a metal compound that reacts to form a compound other than a target compound upon mixing, it is preferable that the concentrations of all metal compound aqueous solutions be adjusted and prepared individually so that the metal compound aqueous solutions are within the ranges described above, and may be supplied as an aqueous solutions of each metal compound into the reaction tank at specified ratios.

The supply amount of the raw material aqueous solution is preferably such that the concentration of the product in the reaction aqueous solution is preferably 30 g/L to 200 g/L, and more preferably 80 g/L to 150 g/L at the end point of the particle growth process. When the concentration of the product is less than 30 g/L, the aggregation of the primary particles may be insufficient in some cases. On the other hand, when the concentration of the product exceeds 200 g/L, stirring of the reaction aqueous solution is not sufficiently carried out in the reaction tank, and the aggregation conditions become nonuniform, so a bias in the particle growth may occur in some cases.

b) Alkaline Aqueous Solution

The alkaline aqueous solution for adjusting the pH value in the reaction aqueous solution is not particularly limited, and a general aqueous alkali metal hydroxide aqueous solution such as sodium hydroxide or potassium hydroxide can be used. It should be noted that the alkali metal hydroxide can be directly added to the reaction aqueous solution in a solid state, however from the aspect of ease of pH control, it is preferable to add the alkali metal hydroxide as an aqueous solution. In this case, the concentration of the alkali metal hydroxide aqueous solution is preferably 20% by mass to 50% by mass, and more preferably 20% by mass to 30% by mass. By setting the concentration of the alkali metal aqueous solution within such a range, it is possible to prevent an increase in the local pH value due to the addition position in the reaction tank while suppressing the amount of solvent to be supplied to the reaction system, or in other words, the amount of water, so it is possible to efficiently obtain a composite hydroxide having a narrow particle size distribution.

The method of supplying the alkaline aqueous solution is not particularly limited as long as the pH value of the reaction aqueous solution does not locally increase and is kept within a specified range. For example, the alkaline aqueous solution can be supplied by a pump capable of flow rate control such as a metering pump while sufficiently stirring the reaction aqueous solution.

c) Aqueous Solution Including a Complexing Agent

The aqueous solution including the complexing agent is not particularly limited as long as the aqueous solution forms a complex with a metal element included in the raw material aqueous solution, particularly at least a complex with nickel in the aqueous reaction solution; however an aqueous solution including an ammonium ion supplier is preferable.

The aqueous solution including the ammonium ion supplier is not particularly limited as long as ammonium ion can be supplied, and for example, an aqueous solution such as ammonia water, ammonium sulfate, ammonium chloride, ammonium carbonate, ammonium fluoride or the like can be used.

In the case where ammonia water is used as the ammonium ion supplier, the concentration thereof is preferably 20% by mass to 30% by mass, and more preferably 22% by mass to 28% by mass. By setting the concentration of the ammonia water within such a range, it is possible to suppress the loss of ammonia from the reaction tank due to volatilization or the like to a minimum, and thus it is possible to improve production efficiency.

Incidentally, as with the alkali aqueous solution, the method of supplying the aqueous solution including the complexing agent can also be supplied by a pump capable of flow rate control.

(2-2) Crystallization Reaction

In the method for producing a composite hydroxide of the present invention, the crystallization reaction is clearly separated into two steps, a nucleation step in which nucleation is mainly performed and a particle growth step in which mainly particle growth is performed, and together with adjusting the conditions of the crystallization reaction in the respective steps, in the particle growth step, the reaction atmosphere, or in other words, the atmosphere in the reaction solution is appropriately switched between a non-oxidizing atmosphere and an oxidizing atmosphere while continuing the supply of the raw material aqueous solution. Particularly, at the time of switching this atmosphere, an atmospheric gas, or in other words, an oxidizing gas or a non-oxidizing gas, or a mixed gas of an oxidizing gas and a non-oxidizing gas is fed into the reaction aqueous solution, and by quickly switching the reaction atmosphere by causing direct contact between the gas and reaction aqueous solution, it is possible to efficiently obtain a composite hydroxide having a particle structure, an average particle size, and a particle size distribution in which the above described low-density layer and the high-density layer are layered. As the non-oxidizing gas, an inert gas is preferable.

[Nucleation Step]

In the nucleation step, first, a transition metal compound that will become the raw material of the composite hydroxide is dissolved in water to prepare a raw material aqueous solution. In addition, an alkaline aqueous solution and an aqueous solution including a complexing agent are supplied into the reaction tank to prepare a pre-reaction aqueous solution in which the pH value measured at a standard liquid temperature of 25° C. is 12.0 to 14.0. The pH value of the pre-reaction aqueous solution can be measured with a pH meter.

Next, the raw material aqueous solution is supplied while stirring this pre-reaction aqueous solution. As a result, in the reaction tank, the reaction aqueous solution of the nucleation step, in other words, an aqueous solution for nucleation is formed. The pH value of this reaction aqueous solution is within the above-described range, so in the nucleation step, particles hardly grow and nucleation occurs preferentially. Incidentally, in the nucleation step, the pH value of the reaction aqueous solution changes as nuclei are formed, so by supplying an alkaline aqueous solution in a timely manner, the pH value of the aqueous reaction solution is controlled so as to be maintained within the range of 12.0 to 14.0 at a standard liquid temperature of 25° C. Moreover, since the concentration of the complexing agent also changes, an aqueous solution including the complexing agent is supplied in a timely manner to control the concentration of the complexing agent in the reaction solution so as to be maintained within a certain range.

In addition, during the nucleation step, by causing an oxidizing gas to flow through the reaction aqueous solution in the reaction tank, the atmosphere in the reaction tank is adjusted to an oxidizing atmosphere having an oxygen concentration higher than 5% by volume. Here, the method of supplying the oxidizing gas to the reaction aqueous solution in the reaction tank, may be either a method of supplying the oxidizing gas to a space in the reaction tank that is in contact with the reaction aqueous solution, or a method of directly supplying the oxidizing gas into the reaction aqueous solution using a diffusing pipe or the like. However, it is sufficient to adjust the reaction atmosphere in the nucleation step by supplying an oxidizing gas into the reaction tank.

In the nucleation step, by supplying an aqueous solution including a raw material aqueous solution, an alkaline aqueous solution, and a complexing agent to the reaction aqueous solution, the nucleus formation reaction is continuously being made to continue, and at the point where there is a specified amount of nuclei formed in the reaction aqueous solution, the nucleation step is terminated.

In this case, the amount of nuclei formed can be determined from the amount of the metal compound included in the raw material aqueous solution supplied to the reaction aqueous solution. The amount of nuclei formed in the nucleation step is not particularly limited, however, in order to obtain a composite hydroxide having a narrow particle size distribution, it is preferable that it becomes 0.1 atomic % to 2 atomic %, and more preferably 0.1 atomic % to 1.5 atomic % with respect to the total amount of metal elements in the metal compound included in the raw material aqueous solution supplied through the nucleation step and the particle growth step. Note that the reaction time in the nucleation step is usually about 0.2 minutes to 5 minutes.

[Particle Growth Step]

After the end of the nucleation step, the pH value of the aqueous solution in the reaction tank for nucleation at a standard liquid temperature of 25° C. is adjusted to 10.5 to 12.0 to form the reaction aqueous solution of the particle growth step, or in other words, the aqueous solution for particle growth. The pH value can also be adjusted by stopping the supply of the alkaline aqueous solution, however, in order to obtain a complex hydroxide having a narrow particle size distribution, it is preferred the pH value be adjusted once the supply of all the aqueous solutions is stopped. More specifically, after the supply of all the aqueous solutions is stopped, it is preferable to adjust the pH value by supplying an inorganic acid having the same group as the metal compound used for preparing the raw material aqueous solution to the reaction aqueous solution.

Next, the supply of the aqueous raw material solution is resumed while stirring this aqueous reaction solution. At this time, since the pH value of the aqueous reaction solution is within the above range, hardly any new nuclei are formed, particle growth progresses, and a crystallization reaction is continued until the secondary particles of the transition metal composite hydroxide reach a specified particle size. Incidentally, since the pH value of the aqueous reaction solution and the concentration of the complexing agent change as particles grow in the particle growth step, it is necessary to supply the alkaline aqueous solution and the complexing agent aqueous solution in a timely manner, and together with maintaining the pH value within the above range, it is necessary to maintain the concentration of the complexing agent within a certain range. Note that the overall reaction time in the particle growth step is usually about 1 hour to 6 hours.

Particularly, in the method for producing a composite hydroxide of the present invention, while maintaining the oxidizing atmosphere in the nucleation step, the center portion of the secondary particles of the composite hydroxide is formed in the initial stage of the particle growth step. Next, after the initial stage of the particle growth step ends, the non-oxidizing gas is supplied into the reaction aqueous solution while continuing the supply of the raw material aqueous solution, whereby the atmosphere in the reaction vessel is changed from an oxidizing atmosphere to a non-oxidizing atmosphere having an oxygen concentration of 5% by volume or less. By crystallization in a non-oxidizing atmosphere, the first high-density layer is formed around the center portion of the secondary particles of the composite hydroxide.

Next, while supplying the raw material aqueous solution, the oxidizing gas is supplied into the reaction aqueous solution to switch again from the non-oxidizing atmosphere to the oxidizing atmosphere having an oxygen concentration higher than 5% by volume. By switching, the first low-density layer is formed so as to cover the first high-density layer. When doing this, in order to prevent excessive mixing of the plate-shaped primary particles at the time of switching the atmosphere, it is possible to temporarily stop the supply of the raw material aqueous solution in cases where it will take time to switch the atmosphere or the like.

Furthermore, by supplying the non-oxidizing gas into the reaction aqueous solution while continuing the supply of the raw material aqueous solution, the oxidizing atmosphere is switched again from the oxidizing atmosphere to the non-oxidizing atmosphere having the oxygen concentration of 5 vol % or less. By switching, the second high-density layer (outer-shell layer) is formed so as to cover the first low-density layer. By performing this kind of control of switching the atmosphere, a structure having a low-density layer is formed between high-density layers around the outside the center portion of the secondary particles of the composite hydroxide, or in other words, a layered structure having a high-density layer, a-low density layer, and an outer-shell layer is formed.

In the particle growth step, directly supplying a non-oxidizing gas and/or an oxidizing gas to the reaction aqueous solution in the reaction vessel, and quickly switching the atmosphere in the reaction vessel from an oxidizing atmosphere having an oxygen concentration higher than 5% by volume to non-oxidizing atmosphere having an oxygen concentration of 5% by volume or less, or quickly switching from the non-oxidizing atmosphere to the oxidizing atmosphere is preferred. As the method of supplying the atmospheric gas into the reaction vessel, depending on the conditions, a method of supplying atmospheric gas to a space in the reaction vessel in contact with the reaction aqueous solution is possible, however, in conditions in which there is a large difference in the oxygen concentration between the oxidizing atmosphere and the non-oxidizing atmosphere, it is preferable to adopt a method of directly supplying the atmospheric gas into an aqueous reaction solution using a diffusing tube or the like. As a result, it is possible to shorten the time for switching the atmosphere and to make it easier to control the reaction time for switching the atmosphere even in cases where the thickness of the high-density layer, the low density layer, or the outer-shell layer is designed to be small. Particularly in the supply to the oxidizing gas, adopting a method of directly supplying oxidizing gas into the reaction aqueous solution is effective in order to prevent oxygen from being consumed by oxidation of manganese or the like and prevent the generation of fine primary particles from being insufficient due to lack of sufficient oxygen.

In the present invention, as described above, the atmosphere is switched at least three times during the crystallization reaction. After that, similarly, it is possible to repeat the control of the reaction atmosphere in which switching from the non-oxidizing atmosphere to the oxidizing atmosphere and switching from the oxidizing atmosphere to the non-oxidizing atmosphere is performed. By such control of switching the atmosphere, an outer-shell portion is formed, the outer-shell portion having a layered structure in which a structure having a low-density layer between high-density layers is layered outside the center portion of secondary particles of the composite hydroxide, or in other words, a layered structure that includes a first-high density layer, a first low-density layer, a second high-density layer, a second low-density layer, and an outer-shell layer.

Incidentally, in this kind of method for producing a composite hydroxide, in the nucleation step and the particle growth step, metal ions in the reaction aqueous solution are precipitated as solid nuclei or primary particles. Therefore, the ratio of the liquid component with respect to the amount of metal ions in the reaction aqueous solution increases. As the reaction progresses, the metal ion concentration in the reaction aqueous solution decreases, so, particularly in the particle growth step, there is a possibility that the growth of the composite hydroxide may be stagnated. Therefore, in order to suppress an increase in the ratio of the liquid component, or in other words, an apparent decrease in the metal ion concentration, preferably after the completion of the nucleation step and during the particle growth step, a part of the liquid component of the reaction aqueous solution is discharged out of the reaction tank. More specifically, preferably the supply of the aqueous solution including the raw material aqueous solution, the alkaline aqueous solution, and the complexing agent to the reaction tank and the stirring of the reaction aqueous solution are temporarily stopped, the solid component in the reaction aqueous solution, or in other words, the composite hydroxide is precipitated out, and only the supernatant liquid of the reaction aqueous solution is discharged to the outside of the reaction tank. By such an operation, it is possible to maintain the metal ion concentration in the reaction aqueous solution, so, not only is it possible to prevent the particle growth from stagnating and to control the particle size distribution of the obtained composite hydroxide to be within a suitable range, it is also possible to improve the density as a powder.

[Controlling the Particle Size of the Complex Hydroxide]

The particle size of the secondary particles of the composite hydroxide can be controlled by the time for performing the nucleation step and the particle growth step, and the pH value of the reaction aqueous solution, the supply amount of the raw material aqueous solution, and the like in the respective steps. For example, in the case where the nucleation step is performed at a high pH value, and the time for performing the nucleation step is made longer, or the metal concentration of the raw material aqueous solution is increased, the amount of nuclei generated in the nucleation step increases, and after the particle growth step, a composite hydroxide having a relatively small particle size can be obtained. On the contrary, in the case where the amount of nuclei generated in the nucleation step is suppressed, or the time for performing the particle growth step is made sufficiently long, a composite hydroxide having a large particle size can be obtained.

[Another Form of the Crystallization Reaction]

In the method for producing a complex hydroxide of the present invention, an aqueous solution for component adjustment that is adjusted to a pH value and a complexing agent concentration suitable for the particle growth step may be prepared separately from the reaction aqueous solution, and to this aqueous solution for component adjustment, the reaction aqueous solution after the nucleation step, preferably the reaction aqueous solution after a part of the liquid component is removed from the reaction aqueous solution after the nucleation step, is added and mixed, and then the particle growth step may be performed using that as the reaction aqueous solution.

In this case, separation of the nucleation step and the particle growth step can be carried out more reliably, so the reaction aqueous solutions in the respective steps can be controlled to an optimum state. Particularly, since the pH value of the aqueous reaction solution can be controlled to be within an optimum range from the start of the particle growth step, the particle size distribution of the obtained composite hydroxide can be narrowed.

(2-3) pH Value

In the method for producing a composite hydroxide of the present invention, the pH value at a standard liquid temperature of 25° C. must be controlled to be within the range of 12.0 to 14.0 when performing the nucleation step, and when performing the particle growth step, the pH value must be controlled to be lower than in the nucleation step and to be within the range of 10.5 to 12.0. Note that in both of the steps, it is preferable to control the variation amount of the pH value during the crystallization reaction to be within ±0.2 with respect to the set value. In the case where the fluctuation amount of the pH value is large, the amount of nucleation in the nucleation step and the degree of particle growth in the particle growth step are not constant, so it becomes difficult to obtain a complex hydroxide having a narrow particle size distribution.

a) pH Value in the Nucleation Step

In the nucleation step, the pH value of the reaction aqueous solution at a standard liquid temperature of 25° C. must be controlled to be within the range 12.0 to 14.0, and preferably 12.3 to 13.5, and more preferably larger than 12.5 but no larger than 13.3. As a result, it is possible to suppress the growth of nuclei in the reaction aqueous solution and give priority to only nucleation, so the nuclei produced in this step can be made homogeneous and have a narrow particle size distribution. Moreover, by setting the pH value higher than 12.5, it is possible to reliably form a structure with many gaps in which fine primary particles are connected at the center portion of secondary particles of the composite hydroxide. When the pH value is less than 12.0, growth of nuclei proceeds as nucleation progresses, so the particle size of the obtained composite hydroxide becomes nonuniform and the particle size distribution widens. On the other hand, when the pH value is higher than 14.0, the nuclei that are generated become too fine, and there arises a problem in that the reaction aqueous solution gels.

b) pH Value in the Particle Growth Step

In the particle growth step, the pH value of the reaction aqueous solution at a standard liquid temperature of 25° C. must be controlled to be within the range of 10.5 to 12.0, and preferably 11.0 to 12.0, and more preferably 11.5 to 12.0. As a result, generation of new nuclei is suppressed, and it is possible to prioritize particle growth, thus the resulting composite hydroxide can be made homogeneous having a narrow particle size distribution. When the pH value is less than 10.5, the ammonium ion concentration increases and the solubility of the metal ions increases, so not only does the rate of the crystallization reaction slow down but also the amount of metal ions remaining in the reaction aqueous solution increases and the productivity decreases. On the other hand, when the pH value is higher than 12.0, the amount of nucleation during the particle growth step increases, the particle size of the composite hydroxide obtained becomes nonuniform, and the particle size distribution becomes wide.

Incidentally, the case where the pH value of the reaction aqueous solution at a standard liquid temperature of 25° C. is 12.0 is the boundary condition between nucleation and particle growth, so depending on the presence or absence of nuclei present in the reaction aqueous solution, the condition for one of the nucleation step or particle growth step can be set. For example, when the pH value in the nucleation step is set to be higher than 12.0 and a large amount of nuclei are produced, after which the pH value in the particle growth step is set to 12.0, a large amount of nuclei as a reactant is present in the reaction aqueous solution, so particle growth preferentially occurs and a composite hydroxide having a narrow particle size distribution can be obtained. On the other hand, when the pH value in the nucleation step is 12.0, since there are no nuclei growing in the reaction aqueous solution, nucleation preferentially occurs, and by making the pH value in the particle growth step lower than 12.0, the growth of the generated nuclei progresses.

In any case, the pH value in the particle growth step is controlled to a value lower than the pH value in the nucleation step, and in order to more clearly separate the nucleation and the particle growth, the pH value in the particle growth step is preferably lower than the pH value in the nucleation step by 0.5 or more, and more preferably by 1.0 or more.

(2-4) Reaction Atmosphere

In the method for producing a complex hydroxide of the present invention, together with control of the pH values in the respective steps, control of the reaction atmosphere has an important significance. In other words, by controlling the pH values in the respective steps, and further adjusting the reaction atmosphere up to the initial stage of the nucleation step and the particle growth step to an oxidizing atmosphere, nuclei are generated, and by particle growth of the respective nuclei, a center portion where the fine primary particles aggregate is formed.

By supplying a non-oxidizing gas into the reaction aqueous solution while continuing the supply of the raw material aqueous solution during the particle growth step, the reaction atmosphere is switched to a non-oxidizing atmosphere, whereby a first high-density layer formed by an aggregation of plate-shaped primary particles is formed so as to cover the outside of the center portion formed by an aggregation of fine primary particles, then, by switching from a non-oxidizing atmosphere to an oxidizing atmosphere, a first low-density layer formed by an aggregation of fine primary particles can be formed so as to cover the outside of the first high-density layer. Furthermore, by switching from an oxidizing atmosphere to a non-oxidizing atmosphere, a second high-density layer (outer-shell layer) formed by an aggregation of plate-shaped primary particles can be formed so as to cover the outside of the first low-density layer.

In this kind of control of the reaction atmosphere, the center portion and the low-density layer normally include needle-like fine primary particles, and the high-density layer and the outer-shell layer include plate-shaped primary particles, however the shapes of the primary particles do not necessarily need to be a needle shape or a plate shape, and may take a shape such as a rectangular parallelepiped shape, an elliptical shape, a rhombohedral shape or the like depending on the composition of the composite hydroxide, the reaction atmosphere and the like. Therefore, in the method for producing a composite hydroxide of the present invention, depending on the composition of the desired composite hydroxide, it is preferred that the reaction atmosphere in each respective stage be appropriately controlled so that the secondary particles have a layered structure of needle-shaped fine primary particles and plate-shaped primary particles that includes a low-density layer having large shrinkage during sintering, and a high-density layer having little shrinkage.

a) Non-Oxidizing Atmosphere

In the production method of the present invention, the reaction atmosphere in the stage of forming the high-density layer and the outer-shell layer, or the first high-density layer, the second high-density layer, and the outer-shell layer that include plate-shaped primary particles is controlled to be a non-oxidizing atmosphere. More specifically, a non-oxidizing gas is introduced so that the oxygen concentration in the atmosphere in the reaction tank is 5% by volume or less, and preferably 2% by volume or less, and more preferably 1% by volume or less. As the non-oxidizing gas, it is preferable to use an inert gas such as argon or nitrogen, however, in addition to this, a mixed gas in which an inert gas is mixed with an oxidizing gas such as the atmosphere air can also be used as long as the oxygen concentration is 5% by volume or less. As a result, it is possible to sufficiently reduce the oxygen concentration in the reaction atmosphere and suppress unnecessary oxidation while allowing the primary particles to grow within a certain range, so the high-density layer of the composite hydroxide can be made to have an aggregated structure of plate-shaped primary particles having an average particle size of 0.3 µm to 3 µm and a narrow particle size distribution.

b) Oxidizing Atmosphere

On the other hand, in the stage of forming a center portion and the low-density layer, the reaction atmosphere is controlled to be an oxidizing atmosphere. More specifically, the reaction atmosphere is controlled so that oxygen concentration in the atmosphere in the reaction tank exceeds 5% by volume, and preferably 10% by volume or more, and more preferably atmospheric atmosphere (oxygen concentration: 21% by volume). By controlling the oxygen concentration in the atmosphere in the reaction to such a range, growth of the primary particles is suppressed by sufficiently increasing the oxygen concentration in the reaction atmosphere, and the average particle size of the primary particles becomes 0.01 µm to 0.3 µm, so a center portion and a low-density layer having a sufficient density difference with the high-density layer are formed.

Incidentally, the upper limit of the oxygen concentration in the oxidizing atmosphere is not particularly limited, however, when the oxygen concentration is excessively high, the average particle size of the primary particles becomes less than 0.01 µm, and in some cases the center portion may not become sufficiently large, or the low-density layer may not have a sufficient thickness. Therefore, it is preferable that the oxygen concentration is 30% by volume or less. Moreover, in order to clarify the difference between the center portion and low-density layer, and the high-density layer, the difference in the oxygen concentration before and after switching the atmosphere should be 3% by volume or more, and preferably 10% by volume or more.

c) Timing of Atmosphere Control

Atmosphere control in the particle growth step is required to be performed at an appropriate timing so that a composite hydroxide having a desired particle structure is formed.

In the method for producing the composite hydroxide of the present invention, in the case where the atmospheric gas is directly supplied into the reaction aqueous solution, the reaction atmosphere, or in other words, the dissolved amount of oxygen in the reaction aqueous solution as the reaction field, changes without delay with respect to the change in the oxygen concentration inside the reaction tank. Therefore, the time of switching the atmosphere can be confirmed by measuring the oxygen concentration inside the reaction tank. On the other hand, in the case of supplying the atmospheric gas to a space that comes in contact with the reaction aqueous solution inside the reaction tank, a time lag occurs between the change in dissolved oxygen amount in the reaction aqueous solution and the change in the oxygen concentration inside the reaction tank, so until the oxygen concentration in the reaction solution is stabilized, the correct value of the amount of oxygen dissolved in the reaction aqueous solution cannot be confirmed; however, similarly, the amount of dissolved oxygen can be confirmed by stabilizing the oxygen concentration in the reaction tank and then performing the measurement. In this way, in either case, the time of switching the atmosphere obtained on the basis of the oxygen concentration in the reaction vessel can be taken to be the time of switching of the amount of dissolved oxygen in the reaction aqueous solution as the reaction field, so with the oxygen concentration inside the reaction tank as a reference, it is possible to appropriately perform control of the reaction atmosphere in a timely manner.

The time of switching the atmosphere is about 0.4% to 2% and more preferably about 0.4% to 1% in a more preferable form with respect to the entire particle growth step as long as a sufficient amount of atmosphere gas is supplied. This time is also common when switching from a non-oxidizing atmosphere to an oxidizing atmosphere or from an oxidizing atmosphere to a non-oxidizing atmosphere. Therefore, even though it is possible to strictly manage the switching time of the atmosphere alone, it is normally sufficient to manage the switching time by including the switching time in the time of the non-oxidizing atmosphere or oxidizing atmosphere after switching the atmosphere.

[Case of the Outer-Shell Portion Having a Three-Layer Structure]

In the case where in the particle growth process, atmosphere control is performed three times from the formation of the center portion to the formation of the outer-shell portion in order to obtain an outer-shell portion having a three-layered structure having one low-density layer sandwiched between the two high-density layers formed on the outside of the center portion, the crystallization reaction time in the oxidizing atmosphere at the initial stage (first stage) of the particle growth step is set to be with the range of 0.5% to 20% with respect to the entire time of the particle growth step, and preferably within the range of 1% to 15%, and more preferably within the range of 3% to 10%. After a time that is 0.5% to 20% of the entire particle growth process time, which is the crystallization reaction time of the initial stage (first stage), has elapsed from the start of the particle growth step, the atmosphere is switched from an oxidizing atmosphere to a non-oxidizing atmosphere by starting the introduction of a non-oxidizing gas having an oxygen concentration of 5% by volume or less, and preferably an inert gas, into the reaction tank. A center portion having an appropriate size is formed according to the nucleation step and the initial stage (first stage) having a reaction time that is regulated within this kind of range.

Next, the crystallization reaction time (including the switching time from the oxidizing atmosphere to the non-oxidizing atmosphere) in the non-oxidizing atmosphere (the second stage) after the start of switching from the first oxidizing atmosphere (the first stage) is within the range of 10% to 80% with respect to the entire time of the particle growth step, and preferably within the range of 30% to 75%, and more preferably within the range of 40% to 70%. The atmosphere is switched from a non-oxidizing atmosphere to an oxidizing atmosphere by implementing the introduction of the oxidizing gas into the reaction tank, after the time of the second-stage crystallization reaction, which is 10% to 80% of the entire time of the particle growth step, has elapsed from the start of the introduction of the non-oxidizing gas. According to the reaction time in the second stage that is within this kind of range, a high-density layer having an appropriate thickness (having a specified high-density layer ratio to particle size) is formed.

Furthermore, the crystallization reaction time (including the switching time from the non-oxidizing atmosphere to the oxidizing atmosphere) in the oxidizing atmosphere (third stage) after the start of switching from the first non-oxidizing atmosphere (second stage) is within the range of 2% to 30% with respect to the entire time of the particle growth step, and preferably within the range of 3% to 20%, and more preferably within the range of 5% to 15%. The atmosphere is switched from an oxidizing atmosphere to a non-oxidizing atmosphere by implementing the introduction of the non-oxidizing gas into the reaction tank, after the time of the third-stage crystallization reaction, which is 2% to 30% of the entire time of the particle growth step, has elapsed from the start of the introduction of the oxidizing gas. According to the reaction time in the third stage that is within this kind of range, a low-density layer having an appropriate thickness (having a specified low-density layer ratio to particle size) is formed.

The crystallization reaction time in order to form the outer-shell layer in the particle growth step in the second non-oxidizing atmosphere (fourth stage) up to the end of the particle growth step (end of the crystallization reaction) after the start of switching from the second oxidizing atmosphere (third stage) is within the range of 10% to 80% of the entire time of the particle growth step, and preferably within the range of 10% to 60%, and more preferably within the range of 15% to 50%. After the crystallization reaction time of the fourth stage, which is 10% to 80% of the entire time, has elapsed, the supply of the raw material aqueous solution is terminated and the crystallization reaction is terminated. According to the reaction time in the fourth stage that is within this kind of range, an outer-shell layer having an appropriate thickness (having a specified outer-shell layer ratio to particle size) is formed.

By successively switching the reaction atmosphere at timing such as described above, it is possible to control the size of the center portion, and the thicknesses of the high-density layer, the low-density layer, and the outer shell layer within a suitable range.

[Case of the Outer-Shell Portion Having a Five-Layer Structure]

In the case where in the particle growth process, the atmosphere control is performed five times from the formation of the center portion to the formation of the outer-shell layer, to obtain a composite hydroxide with an outer-shell portion having a five-layered structure that includes two layered structures constructed by a high-density layer and a low-density layer that are provided inside the outer-shell layer, the crystallization reaction time in the oxidizing atmosphere at the initial stage (first stage) of the particle growth step is within the range of 0.5% to 20% with respect to the entire time of the particle growth step, and preferably within the range of 1% to 15%, and more preferably within the range of 3% to 10%. After the initial stage (first stage) has elapsed, the atmosphere is switched from the oxidizing atmosphere to a non-oxidizing atmosphere by starting the introduction of a non-oxidizing gas.

The crystallization reaction time (including the switching time from the oxidizing atmosphere to the non-oxidizing atmosphere) in the non-oxidizing atmosphere (the second stage) after the start of switching from the first oxidizing atmosphere (the first stage) is within the range of 10% to 75% with respect to the entire time of the particle growth step, and preferably within the range of 30% to 75%, and more preferably within the range of 40% to 70%. After the second stage elapses, oxidizing gas is introduced to switch from the non-oxidizing atmosphere to an oxidizing atmosphere.

The crystallization reaction time (including the switching time from the non-oxidizing atmosphere to the oxidizing atmosphere) in the oxidizing atmosphere (the third stage) after the start of switching from the first non-oxidizing atmosphere (the second stage) is within the range of 2% to 30% with respect to the entire time of the particle growth step, and preferably within the range of 3% to 20%, and more preferably within the range of 5% to 15%. After the third stage elapses, the introduction of non-oxidizing gas is restarted to switch from the oxidizing atmosphere to a non-oxidizing atmosphere.

The crystallization reaction time (including the switching time from the oxidizing atmosphere to the non-oxidizing atmosphere) in the non-oxidizing atmosphere (the fourth stage) after the start of switching from the second oxidizing atmosphere (the third stage) is within the range of 10% to 75% with respect to the entire time of the particle growth step, and preferably within the range of 30% to 75%, and more preferably within the range of 40% to 70%. After the fourth stage elapses, the introduction of oxidizing gas is restarted to switch from the non-oxidizing atmosphere to an oxidizing atmosphere.

The crystallization reaction time (including the switching time from the non-oxidizing atmosphere to the oxidizing atmosphere) in the oxidizing atmosphere (the fifth stage) after the start of switching from the second non-oxidizing atmosphere (the fourth stage) is within the range of 2% to 30% with respect to the entire time of the particle growth step, and preferably within the range of 3% to 20%, and more preferably within the range of 5% to 15%. After the fifth stage elapses, the introduction of non-oxidizing gas is restarted to switch from the oxidizing atmosphere to a non-oxidizing atmosphere.

In order to form the outer-shell layer, the crystallization time of the particle growth step in the third non-oxidizing atmosphere (the sixth stage) after switching from the third oxidizing atmosphere (the fifth stage) up to the end of the particle growth step (end of the crystallization reaction) is within the range of 10% to 75% with respect to the entire time of the particle growth step, and preferably within the range of 10% to 60%, and more preferably within the range of 5% to 50%. After the sixth stage elapses, the supply of raw material aqueous solution is terminated, and the crystallization reaction is terminated.

By switching the reaction atmosphere at this kind of timing, the size of the center portion, and the thicknesses of the first high-density layer, the first low-density layer, the second high-density layer, the second low-density layer and the outer-shell layer of the outer-shell portion can be controlled within suitable ranges.

d) Switching Method

Switching of the reaction atmosphere during the crystallization step can be performed, for example, by circulating an atmospheric gas in a reaction tank, and more specifically, in a space in contact with reaction aqueous solution in the reaction tank, or by inserting a conduit having an inner diameter of about 1 mm to 50 mm into the reaction aqueous solution and bubbling the reaction aqueous solution with an atmospheric gas. In these means, in the case of attempting to switch the atmosphere in a short time of the amount of oxygen dissolved in the reaction aqueous solution, it is necessary to supply a large amount of atmospheric gas. In addition, in the case where the supply of the atmospheric gas is insufficient, it may sometimes be necessary to stop the supply of the raw material aqueous solution during switching to the atmosphere in the particle growth step, and particularly during switching from a non-oxidizing atmosphere to an oxidizing atmosphere. In other words, when the switching of the reaction atmosphere becomes long, unless the supply of the raw material aqueous solution is stopped, a gentle density gradient is formed inside the composite hydroxide, so it may become impossible to make the low-density layer a sufficient thickness.

Switching of the reaction atmosphere can also be performed by directly supplying atmospheric gas into the aqueous reaction solution. By directly supplying the atmospheric gas into the reaction aqueous solution, the switching time of the reaction atmosphere can be shortened, so switching of the reaction atmosphere in the particle growth step can be performed while continuing the supply of the raw material aqueous solution. With this kind of preferable configuration, it is not necessary to stop the supply of the raw material aqueous solution at the time of switching the reaction atmosphere, so the production efficiency can be improved.

The means for supplying atmospheric gas into the reaction aqueous solution is preferably a means capable of directly supplying the atmospheric gas to the whole reaction aqueous solution. As such a means, for example, a diffusing tube can be used. The diffusing tube includes a conduit having many fine pores on the surface and is capable of releasing a large number of fine bubbles in the liquid, so the contact area between the reaction aqueous solution and bubbles is large, and depending on the supply amount of the atmospheric gas, it is possible to easily control the switching time.

As the diffusing tube, it is preferable to use a tube made of a ceramic having excellent chemical resistance under a high pH environment. In addition, as the pore size of the diffusing tube become smaller, the air bubbles that can be released are also smaller, so it becomes possible to switch the reaction atmosphere in a short time. In the present invention, it is preferable to use a diffusing tube having a pore diameter of 100 µm or less, and it is more preferable to use a diffusing tube having a pore diameter of 50 µm or less.

The method of supplying the atmospheric gas that can be suitably applied to the present invention can be arbitrarily adopted as long as the method can generate fine air bubbles as described above and increase the contact area between the reaction aqueous solution and bubbles. Therefore, even in the case of a device other than a diffusing tube, by applying a device that is capable of generating bubbles from the holes of a conduit and finely breaking up and dispersing the bubbles by means of stirring blades or the like, the atmosphere can be similarly switched with high efficiency.

The time required for switching the reaction atmosphere by direct supply of the atmospheric gas into the reaction aqueous solution, in other words, the time for switching the atmosphere is not limited as long as a transition metal complex hydroxide having the above structure can be obtained, however, from the aspect of simplifying control of the particle structure, the time is within reaction time of the atmosphere to be switched, and preferably is within the range of 0.4% to 2% with respect to the entire time of the particle growth process, and more preferably within the range of 0.4% to 1%.

(2-5) Complexing Agent Concentration

The concentration of the complexing agent in the aqueous reaction solution should be an amount capable of keeping the solubility of the metal ions in the aqueous reaction solution constant, however, in the case where an ammonium ion donor is used as the complexing agent, the concentration of ammonium ions in the reaction aqueous solution is preferably maintained at a constant value within the range of 3 g/L to 25 g/L, more preferably 5 g/L to 20 g/L. The ammonium ions function as a complexing agent in the aqueous reaction solution, so when the ammonium ion concentration is less than 3 g/L, the solubility of the metal ions cannot be kept constant, and the reaction aqueous solution easily gels, and thus it is difficult to obtain a transition metal composite hydroxide having a uniform shape and particle size. On the other hand, when the ammonium ion concentration exceeds 25 g/L, the solubility of the metal ions becomes too large, so that the amount of metal ions remaining in the reaction aqueous solution increases, which causes a deviation or the like in the composition of the composite hydroxide.

Note that when the ammonium ion concentration fluctuates during the crystallization reaction, the solubility of the metal ions fluctuates and a uniform composite hydroxide may not be formed. Therefore, it is preferable to control the amount of fluctuation of the ammonium ion concentration within a certain range between the nucleation step and the particle growth step, and more specifically, it is preferable to control the amount of fluctuation to within 5 g/L from the set value. The ammonium ion concentration can be measured with an ion meter.

(2-6) Reaction Temperature

The temperature of the reaction aqueous solution, in other words, the reaction temperature of the crystallization reaction must be controlled throughout the nucleation step and the particle growth step to be preferably within the range of 20° C. or more, and more preferably within the range of 20° C. to 60° C. When the reaction temperature is lower than 20° C., the solubility of the reaction aqueous solution becomes low, which causes nucleation to occur easily, making it difficult to control the average particle size and particle size distribution of the obtained composite hydroxide. It should be noted that the upper limit of the reaction temperature is not particularly limited, however, in the case where an ammonium ion donor is used, when the reaction temperature exceeds 60° C., volatilization of ammonia is promoted and the amount of the aqueous solution that includes the ammonium ion donor to be supplied in order to control the ammonium ions in the reaction aqueous solution within a fixed range increases, so the production cost increases.

(2-7) Coating Step

In the method for producing a complex hydroxide of the present invention, by adding a compound that includes an additional element M to the raw material aqueous solution, and particularly to the aqueous raw material solution used in the particle growth step, a composite hydroxide in which the additional element M is uniformly dispersed to the inside of the particles can be obtained. However, in the case of trying to obtain the effect of adding the additional element M with a smaller addition amount, it is preferable that after the particle growth step, a coating step be performed in which the surface of the secondary particles of the transition metal composite hydroxide is coated with a compound that includes the additional element M.

The coating method is not particularly limited as long as the composite hydroxide can be uniformly coated with the compound including the additional element M. For example, after a composite hydroxide is made into a slurry and the pH value thereof is controlled within a specified range, an aqueous solution for coating in which a compound including an additional element M is dissolved is added, and by precipitating out the compound including the additional element M onto the surface of secondary particles of the composite hydroxide, it is possible to obtain a composite hydroxide that is uniformly coated with the compound including the additional element M. In this case, instead of the coating aqueous solution, an aqueous alkoxide solution of the additional element M may be added to the slurry of composite hydroxide. Moreover, without making a slurry of the composite hydroxide, the composite hydroxide may be coated by spraying an aqueous solution or slurry in which the compound including the additional element M is dissolved, and then drying. Furthermore, coating is also possible by a method of spraying and drying a slurry in which composite hydroxide and a compound including an additional element M are suspended, or by a method of mixing composite hydroxide and a compound including an additional element M by a solid phase method, or the like.

Incidentally, in the case of coating the surface of the composite hydroxide with the additional element M, it is necessary to appropriately adjust the composition of the raw material aqueous solution and the coating aqueous solution so that the composition of the composite hydroxide after coating coincides with the composition of the target composite hydroxide. In addition, the coating step may be applied to the heat-treated particles after the heat treatment of the composite hydroxide in the heat treatment step at the time of production of the positive electrode active material.

(2-8) Production Apparatus

The crystallizer, or in other words, the reaction tank for producing the composite hydroxide of the present invention is not particularly limited as long as it is possible to perform switching of the reaction atmosphere, however, the reaction tank preferably has supply means such as a diffusing tube or the like for directly feeding atmospheric gas into the reaction tank. In an embodiment of the present invention, it is particularly preferable to use a batch type crystallizer that does not recover the precipitated product until the crystallization reaction is completed. In the case of this kind of a crystallizer, unlike a continuous crystallizer that recovers products by the overflow method, growing particles are not recovered simultaneously with the overflow liquid, so the particle structure that includes a low-density layer and a high-density layer is controlled, and a composite hydroxide having a narrow particle size distribution can be obtained with high accuracy. Moreover, in the method for producing a complex hydroxide of the present invention, it is necessary to appropriately control the reaction atmosphere during the crystallization reaction, so using a closed-type crystallizer is particularly preferred.

Figure 2:
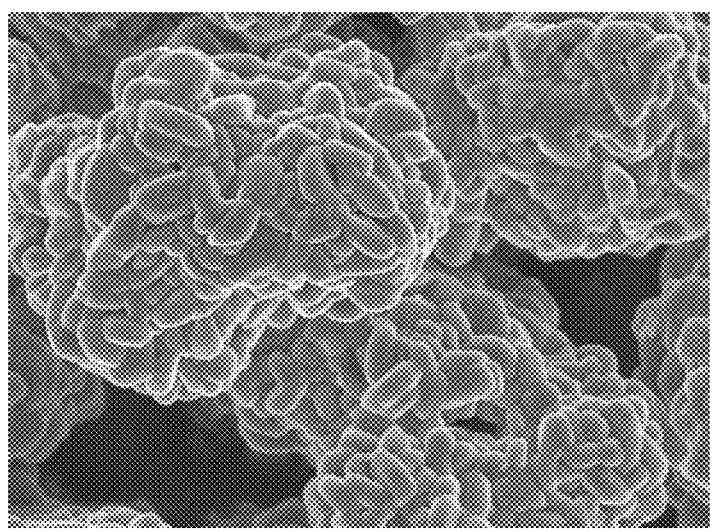
FIG. 2 is an FE-SEM image illustrating the surface of a positive electrode active material for a nonaqueous electrolyte secondary battery obtained in Example 1.
Figure 3:
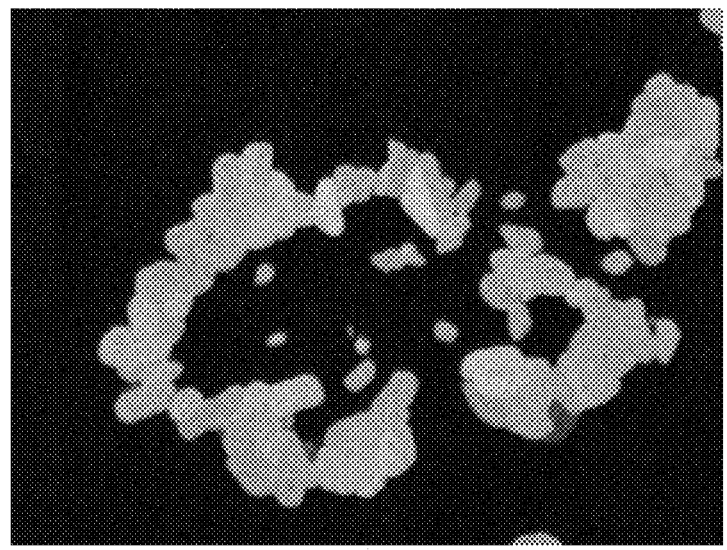
FIG. 3 is a FE-SEM image illustrating a cross section of the positive electrode active material for a nonaqueous electrolyte secondary battery obtained in Example 1.

3. Positive Electrode Active Material for a Nonaqueous Electrolyte Secondary Battery (3-1) Particle Structure of the Positive Electrode Active Material a) Structure of Secondary Particles As illustrated in FIG. 2, the positive electrode active material of the present invention includes secondary particles formed by an aggregation of a plurality of primary particles. In other words, the secondary particles include aggregates of primary particles. Particularly, the positive electrode active material of the present invention does not have a solid structure in which the secondary particles are constructed by sintered aggregates of primary particles, and as illustrated in FIG. 3, it has a structure in which the secondary particles have an outer-shell portion formed by aggregation of primary particles, a center portion that includes an inner space that is inside the outer-shell portion, and a through hole that connects the center portion with the outside. In other word, the secondary particles of the positive electrode active material of the present invention have a hollow structure comprising an outer-shell portion and a space portion inside the outer-shell portion that connects with the outside via the through hole.

In the positive electrode active material having this kind of particle structure, not only an electrolytic solution but also a conductive aid penetrates easily into the center portion of the secondary particle, or in other words, into the internal space via the through hole formed in the outer shell portion, so sufficient insertion/de-insertion of lithium can be achieved not only on the outside surface of the outer-shell portion of the secondary particle but also the inside surface of the outer-shell portion of the secondary particle and parts of the outer-shell portion exposed by the through hole. Therefore, the positive electrode resistance can be further reduced, and the output characteristic can be increased by a corresponding amount.

Further, in the present invention, this kind of structure is realized in a positive electrode active material comprising a lithium transition metal-containing composite oxide which is constructed by secondary particles that are formed by an aggregation of a plurality of primary particles and that have high sphericity, or in other words, that are formed by secondary particles of which the entirety is substantially spherical (including spherical or elliptical), and has a small particle size and a narrow particle size distribution.

In a secondary battery using a positive electrode active material having this kind of structure, in comparison with a secondary battery using a conventional positive electrode active material having the same composition and a small particle size and narrow particle size distribution, a wider range including not only the outside surface of the secondary particles (outer-shell portion) of the positive electrode active material but also the inside surface thereof can be utilized more efficiently as a reaction field with the electrolytic solution, so it is possible to further improve the output characteristics while maintaining the battery capacity and the cycle characteristics to the same extent.

b) Outer-Shell Portion

In the positive electrode active material of the present invention, the outer-shell portion is formed by firing the composite hydroxide of the present invention to substantially integrate an outer-shell portion of the composite hydroxide, or in other words, a high-density layer and an outer-shell layer, or a first high-density layer, a second high-density layer and an outer-shell layer by sintering shrinkage.

The ratio of the thickness of the outer-shell portion to the particle size of the secondary particles of the positive electrode active material (hereinafter referred to as "outer-shell portion ratio to particle size") is preferably 5% to 40%, and more preferably 10% to 35%, and more preferably 15% to 30%. As a result, in the secondary battery using this positive electrode active material, it is possible to improve the output characteristics without impairing the battery capacity and cycle characteristics. However, in the case where the outer-shell portion ratio to particle size is less than 5%, it is difficult to ensure the physical durability of the positive electrode active material, and there is a possibility that the cycle characteristics of the secondary battery may deteriorate. On the other hand, when the outer-shell portion ratio to particle size is larger than 40%, problems occur in that the ratio of the center portion (the ratio of the inner diameter of the outer-shell portion to the particle size of the secondary particles) decreases, the reaction area with the electrolytic solution cannot be sufficiently secured, and a through hole is not sufficiently formed, so there is a possibility that it may be difficult to improve the output characteristics of the secondary battery.

Here, the outer-shell portion ratio to particle size can be obtained as described below using the SEM image of the cross section of the positive electrode active material. First, the thickness of the outer-shell portion is measured at three or more arbitrary positions per particle on the SEM image of the cross section of the positive electrode active material, and the average value is found. Here, the thickness of the outer-shell portion is the distance between two points where the distance from the outer edge of the outer-shell portion of the positive electrode active material to a surface where the outer-shell portion faces inward toward the internal space is the shortest. Similar measurements are performed on 10 or more positive electrode active materials, and the average thickness of the outer-shell portion is found by calculating the average value. Then, by dividing the average thickness of the outer-shell portion by the average particle size of the positive electrode active material, the ratio of the thickness of the outer-shell portion with respect to the particle size of the positive electrode active material can be found. Incidentally, in the positive electrode active material of the present invention, a part of the outer-shell portion is broken due to volumetric shrinkage at the time of firing, and the internal space may be exposed to the outside in some cases. In such a case, the outer-shell portion is determined by presuming that the broken portions are connected, and the thickness of the outer-shell portion is measured at a measurable portion.

c) Through Hole

The positive electrode active material of the present invention is characterized by having a through hole formed in the outer-shell portion that connects the center portion with the outside.

This through hole is formed due to shrinkage of a low-density layer existing between layers of the outer-shell portion when forming an integrated outer-shell portion by sintering and shrinking the outer-shell portion of the composite hydroxide during firing of the composite hydroxide. At least one through hole is formed in the outer-shell portion, the at least one through hole connecting the center portion of the hollow structure and outside. From the aspect of allowing an electrolytic solution and a conductive aid to penetrate to the center portion, it is sufficient that there be one through hole having a specified size in one secondary particle. However, it is possible for a plurality of such through holes to exist in the outer-shell portion, and the number of the through holes is preferably in the range of 1 to 5 per secondary particle, and more preferably a range of 1 to 3.

The number of the through holes can be measured by observing the cross section of the secondary particles or observing the surface using a scanning microscope because the through hole is sufficiently large with respect to the secondary particle size. In surface observation, a through hole can be confirmed by changing the focus. In the surface observation, it is considered that the orientation of the secondary particles is random, and it is not necessarily the case that the through hole always exists in the observable direction of the secondary particle. In other words, when the secondary particle is rotated about two orthogonal axes in a plane perpendicular to the observation direction, the position at which the through hole can be observed is near the upper surface, and at most about 25% in angle in the vicinity of the upper surface for each rotation axis. Therefore, even when a through hole is present on the rear surface or the side surface, the through hole is difficult to be recognized, so when the through hole is observed in 5% or more, preferably 6% or more of the number of secondary particles which can be observed as a whole, it is probabilistically considered that almost all of the secondary particles respectively comprise a through hole. For the number of through holes per secondary particle as well, it is reasonable to exclude secondary particles of which observation of through holes is difficult, so the number is obtained by averaging the number of through holes in the particles in which through holes are observed for the number of particles.

The size (inner diameter) of each through hole must be such that the electrolyte can sufficiently penetrate into the positive electrode active material, and the ratio of the inner diameter to the thickness of the outer-shell portion (hereinafter referred to as "through hole inner diameter ratio to outer-shell portion") is 0.3 or more, and preferably 0.3 to 5, and more preferably 0.4 to 3. When the through hole inner diameter ratio to outer-shell portion is less than 0.3, the inner diameter of the through hole becomes too small with respect to the thickness of the outer-shell portion, and the through hole becomes a through hole having a relatively small inner diameter and a relatively long length, so the electrolytic solution cannot sufficiently penetrate into the internal space (center portion) formed inside the secondary particle, and the conductive aid cannot penetrate to the center portion or the conductive aid that can penetrate is reduced, so when used in a battery, the output capacity and the battery capacity decreases. When the through hole inner diameter ratio to outer-shell portion exceeds 5, the inner diameter of the through hole relatively increases, the strength of the secondary particle decreases, and the physical durability of the positive electrode active material may be insufficient.

Moreover, the inner diameter is preferably within the range of 0.2 µm to 1.0 µm, more preferably within the range of 0.2 µm to 0.7 µm, and even more preferably within the range of 0.3 µm to 0.6 µm. When the inner diameter of the through hole is smaller than 0.2 µm, penetration of the electrolyte into the secondary particle is not sufficiently performed, and there is a further possibility that the conductive aid will not be able to penetrate into the secondary particle. On the other hand, the upper limit value of the inner diameter of the through hole depends on the average particle size of the secondary particles of the positive electrode active material, however, from the aspect of maintaining the physical durability, the upper limit value is preferably about 5% to 20% of the average particle size of the secondary particles.

The inner diameter (average inner diameter) of the through hole, in the case of a secondary particle capable of which an arbitrarily selected through hole can be confirmed by using an SEM image of the cross section of the positive electrode active material, is found by taking the shortest distance between two points on the boundary between the through hole (the space portion connecting the outside and the center portion of the secondary particle) and the outer-shell portion to be the measurement value of the through hole of the secondary particle, then performing a similar measurement on 10 or more secondary particles, and calculating the average value based on the number of secondary particles. In the case where a plurality of through holes are present in a secondary particle, an average value based on the number is calculated from measured values of each through hole in the secondary particle, and the average value is calculated from the average value of the above secondary particle and the measurement values of the other secondary particles. A cross section observation is performed at an arbitrary cross section, and because the center of a through hole is not necessarily on a cross section, a value smaller than the true diameter may be measured due to deviation from the center, however, the meaning of the inner diameter of a through hole here is an average value including values smaller than the true diameter. Even in the case of an inner diameter of such a through hole, sufficient effects can be obtained by specifying the inner diameter within the above range.

(3-2) Average Particle Size

The average particle size of the secondary particles of the positive electrode active material of the present invention is 1 µm to 15 µm, and preferably 3 µm to 12 µm, and more preferably 3 µm to 10 µm. When the average particle size of the positive electrode active material is within such a range, not only can the battery capacity per unit volume of the secondary battery using this positive electrode active material be increased, but also safety and output characteristics can be improved. However, when the average particle size is less than 1 μm, the filling property of the positive electrode active material is lowered and the battery capacity per unit volume cannot be increased. On the other hand, when the average particle size is larger than 15 μm, the contact interface with the electrolytic solution decreases and the reaction area of the positive electrode active material decreases, so that it becomes difficult to improve the output characteristics.

Note that the average particle size of the positive electrode active material means the volume-based average particle size (MV) as in the case of the above-mentioned composite hydroxide and can be obtained by a laser light diffraction scattering type particle size analyzer.

(3-3) Particle Size Distribution

The value of [(d90−d10)/average particle size], which is an index indicating the spread of the particle size distribution of the positive electrode active material of the present invention, is 0.70 or less, and preferably 0.60 or less, and more preferably 0.55 or less, and the positive electrode active material of the present invention is constructed by powder having a very narrow particle size distribution. This kind of positive electrode active material is such that the ratio of fine particles and coarse particles is small, and a secondary battery using this positive electrode active material has excellent safety, cycle characteristics, and output characteristics.

On the other hand, when the value of [(d90−d10)/average particle size] exceeds 0.70, the ratio of fine particles and coarse particles in the positive electrode active material increases. For example, in a secondary battery using a positive electrode active material having a large ratio of fine particles, the secondary battery is liable to generate heat due to local reaction of the fine particles, so not only the safety deteriorates but also due to the selective deterioration of the particles, the cycle characteristics are inferior. In addition, in a secondary battery using a positive electrode active material having a large ratio of coarse particles, the reaction area of the electrolytic solution and the positive electrode active material cannot be sufficiently maintained and the output characteristics are inferior.

When production on an industrial scale is taken into consideration, it is not practical from the aspect of yield, productivity, or production cost to prepare a complex hydroxide in a powder state in which the value of [(d90−d10)/average particle size] is excessively small as a precursor. Therefore, it is preferable to set the lower limit value of [(d90−d10)/average particle size] of the positive electrode active material to about 0.25.

The meanings of d10 and d90 in the index [(d90−d10)/average particle size] indicating the spread of the particle size distribution in the positive electrode active material and the methods of obtaining these are the same as those of the composite hydroxide.

(3-4) Specific Surface Area

In the positive electrode active material of the present invention, the specific surface area is preferably 1.3 m$^2$/g to 4.0 m$^2$/g, and more preferably 1.5 m$^2$/g to 3.0 m$^2$/g. The positive electrode active material having a specific surface area within such a range has a large contact area with the electrolytic solution, and the output characteristics of a secondary battery using this positive electrode active material can be greatly improved. However, when the specific surface area of the positive electrode active material is less than 1.3 m$^2$/g, it is impossible to maintain a reaction area with the electrolytic solution when forming a secondary battery, and it is difficult to sufficiently improve the output characteristics. On the other hand, when the specific surface area of the positive electrode active material is larger than 4.0 m$^2$/g, the reactivity with the electrolytic solution becomes too high, so that thermal stability may be lowered in some cases.

Here, the specific surface area of the positive electrode active material can be measured, for example, using the BET method by nitrogen gas adsorption.

(3-5) Tap Density

In the positive electrode active material of the present invention, the tap density, which is an index of the filling property, is preferably 1.1 g/cm$^3$ or more, more preferably 1.2 g/cm$^3$ or more, and more preferably 1.3 g/cm$^3$. When the tap density is less than 1.1 g/cm$^3$, the filling property is low and the battery capacity of the whole secondary battery cannot be sufficiently improved in some cases. On the other hand, the upper limit of the tap density is not particularly limited, however, the upper limit under ordinary manufacturing conditions is about 3.0 g/cm$^3$.

Note that the tap density represents the bulk density after tapping the sample powder collected in a container 100 times, based on JIS Z 2512:2012, and can be measured using a shaking specific gravity measuring device.

(3-6) Surface Area Per Unit Volume

Similar to the tap density, the positive electrode active material of the present invention has a surface area per unit volume, which is a large index of the filling property of the positive electrode active material, of preferably 1.7 m$^2$/cm$^3$ or more, and more preferably 2.1 m$^2$/cm$^3$ or more, and even more preferably 2.3 m$^2$/cm$^3$ or more. As a result, it is possible to increase the contact area with the electrolytic solution while maintaining the filling property of the positive electrode active material as powder, and thus it is possible to simultaneously improve the output characteristics and the battery capacity. Incidentally, the surface area per unit volume can be obtained from the product of the specific surface area of the positive electrode active material and the tap density.

(3-7) Composition

Since the positive electrode active material of the present invention is characterized by the particle structure of the secondary particles, the composition thereof is not limited as long as the secondary particles have the above-mentioned particle structure. However, the present invention can be suitably applied to a positive electrode active material having a composition represented by the general formula (B): $Li_{1+u}Ni_xMn_yCo_zM_tO_2$, where $-0.05 \leq u \leq 0.50$, $x+y+z+t=1$, $0.3 \leq x \leq 0.95$, $0.05 \leq y \leq 0.55$, $0 \leq z \leq 0.4$, $0 \leq t \leq 0.1$, and M is one or more kind of addition element selected from among Mg, Ca, Al, Ti, V, Cr, Zr, Nb, Mo, Hf, Ta, and W.

In this positive electrode active material, the value of u that indicates the excess amount of lithium (Li) is preferably no less than −0.05 and no greater than 0.50, and more preferably no less than 0 and no greater than 0.50, and even more preferably no less than 0 and no more and 0.35. By setting the value of "u" within the above-described range, it is possible to improve the output characteristics and the battery capacity of a secondary battery using this positive electrode active material as the positive electrode material. However, when the value of "u" is less than −0.05, the positive electrode resistance of the secondary battery increases, so the output characteristics cannot be improved. On the other hand, when "u" is larger than 0.50, not only the initial discharge capacity decreases, but also the positive electrode resistance increases.

Nickel (Ni) is an element contributing to high potential and high capacity of the secondary battery, and the value of "x" indicating the content thereof is preferably no less than 0.3 and no more than 0.95, and more preferably no less than 0.3 and no more than 0.9. When the value of "x" is less than 0.3, the battery capacity of a secondary battery using this positive electrode active material cannot be improved. On the other hand, when the value of "x" exceeds 0.95, the content of other metallic elements decreases, and the effects of those elements cannot be obtained.

Manganese (Mn) is an element contributing to the improvement of thermal stability, and the value of "y" indicating the content thereof is preferably no less than 0.05 and no more than 0.55, and more preferably no less than 0.10 and no more than 0.40. When the value of "y" is less than 0.05, the thermal stability of a secondary battery using this positive electrode active material cannot be improved. On the other hand, when the value of "y" exceeds 0.55, Mn is eluted from the positive electrode active material during high temperature operation, thereby deteriorating the charge and discharge cycle characteristics.

Cobalt (Co) is an element contributing to improvement of the charge-discharge cycle characteristics, and the value of "z" indicating the content thereof is preferably no less than 0 and no more than 0.4, and more preferably no less than 0.10 and no more than 0.35. When the value of "z" exceeds 0.4, the initial discharge capacity of a secondary battery using this positive electrode active material is greatly reduced.

In the case of the positive electrode active material of the present invention, in order to further improve the durability and output characteristics of the secondary battery, an additional element M may be contained in addition to the above-described transition metal elements. As such an additional element M, it is possible to use one or more kind selected from magnesium (Mg), calcium (Ca), aluminum (Al), titanium (Ti), vanadium (V), chromium (Cr), zirconium (Zr), niobium (Nb), molybdenum (Mo), hafnium (Hf), tantalum (Ta), and tungsten (W).

The value of "t" indicating the content of the additional element M is preferably no less than 0 and no more than 0.1, and more preferably no less than 0.001 and no more than 0.05. When the value of "t" is larger than 0.1, the metallic element contributing to the Redox reaction decreases, so the battery capacity decreases.

This kind of additional element M may be uniformly dispersed inside the particles of the positive electrode active material or may be coated on the surface of the particle of the positive electrode active material. Furthermore, the additional element M may be uniformly dispersed inside of the particles and coated on the surface thereof. In any case, it is necessary to control the content of the additional element M to be within the above-describe range.

Incidentally, in the case of the above-described positive electrode active material, in order to further improve the battery capacity of a secondary battery using this positive electrode active material, the composition thereof is preferable adjusted so at to be represented by the general formula (B1): $Li_{1+u}Ni_xMn_yCo_zM_tO_2$, where $-0.05 \leq u \leq 0.20$, $x+y+z+t=1$, $0.7<x\leq0.95$, $0.05\leq y\leq 0.2$, $0\leq z\leq 0.2$, $0\leq t\leq 0.1$, and M is one or more kind of additional element selected from among Mg, Ca, Al, Ti, V, Cr, Zr, Nb, Mo, and W. Particularly, when compatibility with thermal stability is to be attained, it is more preferable to set the value of x in the general formula (B1) to $0.7<x\leq 0.9$, and even more preferably to $0.7<x\leq 0.85$.

On the other hand, in order to further improve the thermal stability, the composition of the positive electrode active material is preferably adjusted so as to be represented by the general formula (B2): $Li_{1+u}Ni_xMn_yCo_zM_tO_2$, where $-0.05\leq u\leq 0.50$, $x+y+z+t=1$, $0.3\leq x\leq 0.7$, $0.1\leq y\leq 0.55$, $0\leq z\leq 0.4$, $0\leq t\leq 0.1$, and M is one or more kind of additional element selected from among Al, Ti, V, Cr, Zr, Nb, Mo, Hf, Ta and W.

4. Method for Producing Positive Electrode Active Material for a Nonaqueous Electrolyte Secondary Battery The method for producing the positive electrode active material of the present invention is not particularly limited as long as the method can use the above-described composite hydroxide as a precursor to form a positive electrode active material having a specified structure, average particle size, and particle size distribution. However, in the case of performing production on an industrial scale, preferably the positive electrode active material is formed by a production method that includes a mixing step of mixing the above-mentioned composite hydroxide with a lithium compound to obtain a lithium mixture, and a firing step of firing the obtained lithium mixture in an oxidizing atmosphere at a temperature of 650° C. to 1000° C. Incidentally, if necessary, steps such as a heat treatment step, a pre-firing step and the like may be added to the above-mentioned steps. With this kind of production method, the above-described positive electrode active material, and particularly the positive electrode active material represented by the general formula (B) can be easily obtained.

(4-1) Heat Treatment Step

In the method of producing the positive electrode active material of the present invention, and heat-treated particles obtained by heat treating a composite hydroxide may be mixed with a lithium compound. Here, as the heat-treated particles, not only the composite hydroxide from which excess moisture has been removed in the heat treatment step, but also a transition metal-containing composite oxide converted into an oxide by a heat treatment step, or a mixture thereof are also included.

The heat treatment step is a step of removing excess moisture included in the composite hydroxide by heating the composite hydroxide to a temperature in the range of 105° C. to 750° C. As a result, moisture remaining until the firing step can be reduced to a certain amount, and variation in the composition of the obtained positive electrode active material can be suppressed. When the heating temperature is lower than 105° C., excessive moisture in the composite hydroxide cannot be removed, and the variation cannot be sufficiently suppressed in some cases. On the other hand, when the heating temperature is higher than 700° C., further effects cannot be expected, however the production cost increases.

Moreover, in the heat treatment step, it is sufficient that moisture can be removed to such an extent that the number of atoms of each metal component in the positive electrode active material and the ratio of the number of atoms of Li do not vary, so it is not always necessary to convert all of the composite hydroxide to composite oxide. However, in order to reduce variations in the number of atoms of the respective metal components and the ratio of the number of atoms of Li, preferably heating is performed at 400° C. or more to convert all of the composite hydroxide to complex oxide. Note that by using chemical analysis to previously determine the metal component ratio included in the composite hydroxide according to the heat treatment condition and determine the mixing ratio with the lithium compound, it is possible to further suppress the above-mentioned variation.

The atmosphere under which the heat treatment is performed is not particularly limited, and may be a nonreducing atmosphere, however it is preferable to perform the heat treatment in a flow of air that can be easily performed.

The heat treatment time is not particularly limited, however, from the aspect of sufficiently removing excess moisture in the composite hydroxide, the heat treatment time is preferably at least 1 hour, and more preferably 5 hours to 15 hours.

(4-2) Mixing Step

The mixing step is a step of mixing a lithium compound into a composite hydroxide or heat-treated particles to obtain a lithium mixture.

In the mixing step, it is necessary to mix the composite hydroxide or heat-treated particle with the lithium compound so that the ratio (Li/Me) of the number (Li) of atoms of lithium to the number (Me) of metal atoms other than lithium in the lithium mixture, more specifically, the sum of the number of atoms of nickel, cobalt, manganese, and additional element M, becomes 0.95 to 1.5, and preferably 1.0 to 1.5, and more preferably 1.0 to 1.35, and even more preferably 1.0 to 1.2. In other words, the value of Li/Me does not change before and after the firing step, so it is necessary to mix the composite hydroxide or heat-treated particle with the lithium compound so that the value of Li/Me in the mixing step becomes the Li/Me value of the target positive electrode active material.

The lithium compound used in the mixing step is not particularly limited, however, from the aspect of availability, it is preferable to use lithium hydroxide, lithium nitrate, lithium carbonate, or a mixture thereof. Particularly, taking into consideration the ease of handling and stability of quality, it is preferable to use lithium hydroxide or lithium carbonate.

It is preferable that the composite hydroxide or heat-treated particles and the lithium compound are mixed sufficiently so as not to produce fine powder. When mixing is insufficient, the value of Li/Me varies among the individual particles, and sufficient battery characteristics may not be obtained in some cases. Incidentally, for mixing, a general mixer can be used. For example, a shaker mixer, a Lodige mixer, a Julia mixer, a V blender, or the like may be used.

(4-3) Pre-Firing Step

In the case where lithium hydroxide or lithium carbonate is used as the lithium compound, after the mixing step and before the firing step, a pre-firing step may be performed in which the lithium mixture is pre-fired at a temperature lower than the firing temperature and within a range of 350° C. to 800° C., and preferably within a range of 450° C. to 780° C. As a result, lithium can be sufficiently diffused into the composite hydroxide or heat-treated particles, and a more uniform positive electrode active material can be obtained.

Incidentally, the holding time at the above temperature is preferably 1 hour to 10 hours, and more preferably 3 hours to 6 hours. In addition, the atmosphere in the pre-firing step is preferably an oxidizing atmosphere, similar to the firing step described later, more preferably is an atmosphere having an oxygen concentration of 18% by volume to 100% by volume.

(4-4) Firing Step

In the firing step, the lithium mixture obtained in the mixing step is fired under specified conditions to diffuse lithium into the composite hydroxide or heat-treated particles to obtain a positive electrode active material.

In this firing step, the center portion in the composite hydroxide or heat-treated particles is a structure having many gaps in which fine primary particles are connected, so sintering proceeds from a low temperature region, shrinkage occurs from the center of the particles to the high-density layer side where sintering progresses slowly, and an internal space having a specified size is formed at the center of the secondary particle.

The high-density layer and the outer-shell layer (or the first high-density layer, the second high-density layer, and the outer-shell layer) of the composite hydroxide and the heat-treated particles are sintered and shrunk and substantially integrated, and in the positive electrode active material, primary particle aggregates are formed in one outer-shell portion.

On the other hand, since the low-density layer includes fine primary particles, as in the case of the center portion, sintering starts in a lower temperature region than the high-density layer or the outer-shell layer. At this time, since the amount of volume shrinkage of the low-density layer is larger than that of the high-density layer or the outer-shell layer, volume shrinkage of the fine primary particles of the low-density layer occurs in a direction toward the high-density layer or the outer-shell layer where the progression of sintering is slow, so gaps having a suitable size are formed between the high-density layer and the outer-shell layer or between the first high-density layer and the second high-density layer and between the second high-density layer and the outer-shell layer. Since these gaps do not have a radial thickness enough to retain their shape, they are absorbed by the high-density layer or the outer shell layer as the high-density layer and the outer shell layer are sintered, and since the absorbed volume is insufficient, by the high-density layer and the outer-shell layer shrinking while becoming integrated at the time of firing, a through hole is formed in the outer-shell portion of the formed positive electrode active material so as to connect the internal space of the secondary particle with the outside. Incidentally, there is electrical conduction as an entire outer-shell portion between the high-density layer and the outer shell portion (or between the first high-density layer and the second high-density layer and between the second high-density layer and the outer-shell portion) as a result of integration by sintering and shrinkage.

In this way, in the positive electrode active material of the present invention, it can be said that the entire outer shell portion is electrically conducting and the cross-sectional area of the conduction path is sufficiently maintained. As a result, as one outer-shell portion, it is possible to utilize the inner and outer surfaces of the positive electrode active material as a reaction field with the electrolytic solution, so that the internal resistance of the positive electrode active material is greatly reduced, and in the case of forming a secondary battery, it is possible to improve the output characteristics without impairing the battery capacity and cycle characteristics.

The particle structure of this kind of positive electrode active material is basically determined according to the particle structure of the composite hydroxide which is a precursor, however, since the particle structure may be influenced by the composition, firing conditions and the like, after performing a preliminary test, it is preferable to appropriately adjust the respective condition so that a desired structure is obtained.

The furnace used in the firing step is not particularly limited, and any furnace capable of firing the lithium mixture in air or an oxygen flow may be used. However, from the viewpoint of keeping the atmosphere in the furnace uniform, an electric furnace free from gas generation is preferable, and either a batch type or a continuous type electric furnace may be suitably used. In regard to this point, the same also applies to furnaces used for the heat treatment step and the pre-firing step.

a) Firing Temperature

It is necessary for the firing temperature of the lithium mixture to be 650° C. to 1000° C. When the firing temperature is lower than 650° C., lithium does not sufficiently diffuse into the composite hydroxide or heat-treated particles, excess lithium or unreacted composite hydroxide or heat-treated particles remain, or the crystallinity of the obtained positive electrode active material may become insufficient in some cases. On the other hand, when the firing temperature is higher than 1000° C., extreme sintering occurs among the particles of the positive electrode active material, causing abnormal particle growth, and the ratio of amorphous or protean coarse particles increases.

In the case where it is desired to obtain a positive electrode active material represented by the above-described general formula (B1), it is preferable for the firing temperature to be 650° C. to 900° C. On the other hand, in the case of trying to obtain the positive electrode active material represented by the general formula (B2), it is preferable for the firing temperature to be 800° C. to 980° C.

In addition, the rate of increased temperature in the firing step is preferably 2° C./min to 10° C./min, and more preferably 5° C./min to 10° C./min. Furthermore, during the firing step, it is preferable to maintain the temperature at around the melting point of the lithium compound for 1 hour to 5 hours, and more preferably 2 hours to 5 hours. As a result, the composite hydroxide or the heat-treated particles and the lithium compound can be more uniformly reacted.

b) Firing Time

Of the firing time, the holding time at the above-described firing temperature is preferably at least 2 hours, and more preferably 4 hours to 24 hours. When the holding time at the firing temperature is less than 2 hours, lithium does not sufficiently diffuse into the composite hydroxide or heat-treated particles, excess lithium or unreacted complex hydroxide or heat-treated particles remain, or crystallinity of the obtained positive electrode active material may be insufficient.

Note that after completion of the holding time, the cooling rate from the firing temperature to at least 200° C. is preferably 2° C./min to 10° C./min, and more preferably 33° C./min to 77° C./min. By controlling the cooling rate within this kind of a range, it is possible to prevent equipment such as a sagger from being damaged by rapid cooling while maintaining productivity.

c) Firing Atmosphere

The atmosphere at the time of firing is preferably an oxidizing atmosphere, and more preferably is an atmosphere having an oxygen concentration of 18% by volume to 100% by volume, and particularly it is preferable to use a mixed atmosphere of oxygen having the above-described oxygen concentration and an inert gas. In other words, it is preferable that firing be carried out in an atmosphere air flow or in an oxygen flow. When the oxygen concentration is less than 18% by volume, the crystallinity of the positive electrode active material may be insufficient.

(4-5) Cracking Step

In some cases, the positive electrode active material obtained by the firing step is aggregated or somewhat sintered. In such a case, it is preferable to physically crack the aggregate or sintered body of the positive electrode active material. As a result, it is possible to adjust the average particle size and particle size distribution of the obtained positive electrode active material to be within a suitable range. It should be noted that cracking is a process in which mechanical energy is added to an aggregate of a plurality of secondary particles generated by sintering necking or the like between secondary particles at the time of firing, and to loosen the aggregate by separating the secondary particles without substantially the secondary particles destroyed.

As the cracking method, a known means can be used, for example, a pin mill, a hammer mill or the like may be used. Incidentally, at this time, it is preferable to adjust the cracking force to be within an appropriate range so as not to destroy the secondary particles.

5. Nonaqueous Electrolyte Secondary Battery

The nonaqueous electrolyte secondary battery of the present invention includes the same components as a general nonaqueous electrolyte secondary battery such as a positive electrode, a negative electrode, a separator, and a nonaqueous electrolytic solution, and the like. It should be noted that the embodiment described below is merely an example, and the nonaqueous electrolyte secondary battery of the present invention is such that various modified and improved forms may be applied based on the embodiments described in this specification.

(5-1) Components a) Positive Electrode

Using the positive electrode active material of the present invention, for example, a positive electrode of a nonaqueous electrolyte secondary battery is prepared as described below.

First, a conductive material and a binding agent are mixed into the positive electrode active material of the present invention, activated carbon or a solvent for viscosity control or the like is added if necessary, and these are kneaded to prepare a positive electrode composite paste. At that time, the mixing ratio of each in the positive electrode mixture paste also becomes an important factor for determining the performance of the nonaqueous electrolyte secondary battery. For example, in the case where the solid content of the positive electrode material mixture excluding the solvent is taken to be 100 parts by mass, as in the case of the positive electrode of a general nonaqueous electrolyte secondary battery, the content of the positive electrode active material may be taken to be 60 parts by mass to 95 parts by mass, the content of the conductive material may be taken to be 1 parts by mass to 20 parts by mass, and the content of the binding agent may be taken to be 1 part by mass to 20 parts by mass.

The obtained positive electrode composite paste is coated on the surface of a current collector made of aluminum foil, for example, and dried to scatter the solvent. When necessary, pressure may be applied by a roll press or the like in order to increase the electrode density. In this way, a sheet-like positive electrode can be produced. The sheet-like positive electrode can be cut into an appropriate size depending on the intended battery and used for manufacturing the battery. Note that the method for manufacturing the positive electrode is not limited to the example described above, and other methods may be used.

As the conductive material, for example, graphite (natural graphite, artificial graphite, expanded graphite, and the like), carbon black material such as acetylene black, ketjen black and the like can be used.

The binding agent plays a role of binding the active material particles, and, for example, polyvinylidene fluoride (PVDF), polytetrafluoroethylene (PTFE), fluororubber, ethylene propylene diene rubber, styrene butadiene, cellulose resin or polyacryl acid can be used.

In addition, when necessary, a solvent capable of dispersing the positive electrode active material, the conductive material and the activated carbon, and dissolving the binding agent can be added to the positive electrode material mixture. More specifically, organic solvents such as N-methyl-2-pyrrolidone and the like can be used as the solvent. In addition, activated carbon can be added to the positive electrode mixture to increase the electric double layer capacity.

b) Negative Electrode

For the negative electrode, metallic lithium, a lithium alloy or the like can be used. Moreover, a paste-like negative electrode mixture obtained by mixing a binding agent with a negative electrode active material capable of adsorption and desorption of lithium ions and adding an appropriate solvent is applied to the surface of a metal foil current collector such as copper and dried, and as necessary compressed so as to increase the electrode density, can be used.

As the negative electrode active material, for example, powdery lithium-containing substances such as metallic lithium, lithium alloys, and the like, organic graphite fired bodies capable of adsorption and desorption of lithium ions such as natural graphite, artificial graphite, phenolic resin, and the like, and carbon materials such as coke can be used. In this case, as the negative electrode binding agent, as in the case of the positive electrode, a resin that includes fluorine such as PVDF or the like can be used, and as a solvent for dispersing the active material and the binding agent, an organic solvent such as N-methyl-2-pyrrolidone or the like can be used.

c) Separator

The separator is sandwiched and arranged between the positive electrode and the negative electrode and has a function of separating the positive electrode and the negative electrode and holding the nonaqueous electrolyte. As this kind of a separator, for example, a thin film made of polyethylene, polypropylene or the like and having many fine pores can be used, however is not particularly limited as long as the separator has the function described above.

d) Nonaqueous Electrolyte

As the nonaqueous electrolyte, in addition to a nonaqueous electrolyte obtained by dissolving a lithium salt as a supporting salt in an organic solvent, a nonflammable solid electrolyte having ionic conductivity, and the like is used.

As the organic solvent used for the nonaqueous electrolytic solution, one kind alone, or a mixture of two or more kinds selected from:

cyclic carbonates such as ethylene carbonate, propylene carbonate, butylene carbonate, trifluoropropylene carbonate, and the like;

chain carbonates such as diethyl carbonate, dimethyl carbonate, ethyl methyl carbonate, dipropyl carbonate, and the like;

ether compounds such as tetrahydrofuran, 2-methyltetrahydrofuran, dimethoxyethane, and the like;

sulfur compounds such as ethyl methyl sulfone, butane sultone, and the like; and phosphorus compounds such as triethyl phosphate, trioctyl phosphate, and the like can be used.

As the supporting salt, $LiPF_6$, $LiBF_4$, $LiClO_4$, $LiAsF_6$, $LiN(CF_3SO_2)_2$, complex salts of these and the like can be used.

Incidentally, the nonaqueous electrolytic solution may include a radical scavenger, a surfactant, a flame retardant, or the like.

On the other hand, as the solid electrolyte, $Li_{1.3}Al_{0.3}Ti_{1.7}(PO_4)_3$, $Li_2S$—$SiS_2$ or the like can be used.

(5-2) Structure

The nonaqueous electrolyte secondary battery of the present invention comprising the positive electrode, the negative electrode, the separator, and the nonaqueous electrolyte described above can have various shapes such as a cylindrical shape, a laminated shape, and the like.

Regardless of which shape is adopted, for example, a positive electrode and a negative electrode are laminated via a separator to form an electrode body, the obtained electrode body is impregnated with a nonaqueous electrolytic solution, a current collecting lead or the like is used to connect between the positive electrode current collector and a positive electrode terminal leading to the outside, and between the negative electrode current collector and a negative electrode terminal leading to the outside, and the contents are then sealed in a battery case to complete the nonaqueous electrolyte secondary battery.

(5-3) Characteristics

As described above, the nonaqueous electrolyte secondary battery of the present invention uses the positive electrode active material of the present invention as a positive electrode material, so together with having excellent battery capacity and cycle characteristics, the output characteristics are drastically improved compared with the conventional structure. Moreover, in comparison with a secondary battery using a positive electrode active material comprising a conventional lithium nickel composite oxide, thermal stability and safety are in no way inferior.

Figure 6:
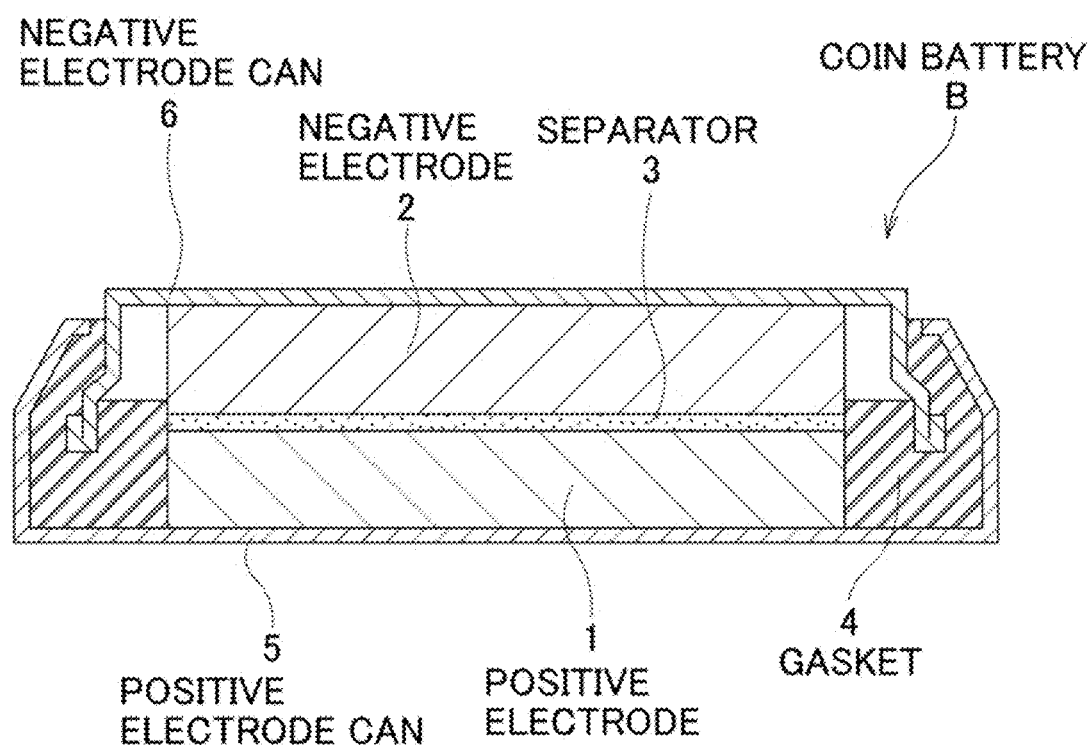
FIG. 6 is a schematic sectional view of a 2032 type coin battery used for battery evaluation.

For example, when a 2032-type coin battery as illustrated in FIG. 6 is constructed by using the positive electrode active material of the present invention, an initial discharge capacity of 150 mAh/g or more, and preferably 158 mAh/g or more, a positive electrode resistance of 1.10Ω or less, and preferably 1.00Ω or less, and a 500 cycle capacity retention rate of 75% or more, and preferably 80% or more can be achieved at the same time.

(5-4) Uses

As described above, the nonaqueous electrolyte secondary battery of the present invention has excellent battery capacity, output characteristics, and cycle characteristics, and can be suitably used as a power source for small portable electronic devices (laptop personal computers, mobile phones, and the like) that are required to have these characteristics at a high level. In addition, of these characteristics, the nonaqueous electrolyte secondary battery of the present invention has greatly improved output characteristics and is excellent in safety, and not only can this nonaqueous electrolyte secondary battery be made to be more compact and have higher output, expensive protection circuitry can be simplified, so this nonaqueous electrolyte secondary battery can be suitably used as a power supply for transportation equipment in which the mounting space is limited.

EXAMPLES

In the following, the present invention will be described in detail using Examples and Comparative Examples. Moreover, these are examples of an embodiment of the present invention, and the present invention is not limited to the contents of these examples. In the following Examples and Comparative Examples, unless otherwise specified, samples of special grade reagents manufactured by Wako Pure Chemical Industries, Ltd. were used for preparing the transition metal-containing composite hydroxide and the positive electrode active material, respectively. In addition, during the nucleation step and the particle growth step, the pH value of the aqueous reaction solution was measured with a pH controller (NPH-690D, manufactured by Nissin Rika Co., Ltd.), and by adjusting the amount of sodium hydroxide aqueous solution supplied based on the measured value, the pH value of the reaction aqueous solution in each step was controlled within the range of a variation amount of ±0.2 with respect to the setting value for the step.

Example 1 a) Production of a Transition Metal Composite Hydroxide
[Nucleation Step]

First, 1.4 L of water was placed in a 6 L reaction tank, and the temperature in the tank was set at 40° C. while stirring. When doing this, atmospheric air was circulated in the reaction tank for 30 minutes, and the reaction atmosphere was set to the air atmosphere (oxygen concentration: about 21% by volume). Subsequently, a pre-reaction aqueous solution was formed by supplying an appropriate amount of 25% by mass sodium hydroxide aqueous solution and 25% by mass aqueous ammonia into the reaction tank, adjusting the pH value to 12.8 at a standard liquid temperature of 25° C., and adjusting the ammonium ion concentration to be 10 g/L.

Simultaneously, nickel sulfate, cobalt sulfate, manganese sulfate and zirconium sulfate were dissolved in water so that the molar ratio of the respective metal elements was Ni:Mn:Co:Zr=33.1:33.1:33.1:0.2, and 2 mol/L of a raw material aqueous solution was prepared.

Next, this raw material aqueous solution was supplied to the pre-reaction aqueous solution at a flow rate of 10 ml/min to form a reaction aqueous solution, and nucleation was carried out for 3 minutes by a crystallization reaction. During this process, a 25% by mass sodium hydroxide aqueous solution and 25% by mass ammonia water were supplied in a timely manner so that the pH value of the aqueous reaction solution was maintained within the range of 13.1±0.2 and the ammonium ion concentration was maintained within the range of 10 g/L±2 g/L.

[Particle Growth Step]

After completion of the nucleation step, supply of all the aqueous solutions into the reaction tank was temporarily stopped, sulfuric acid was then added to the reaction tank, and the pH value of the reaction aqueous solution was adjusted to 11.6 at a standard liquid temperature of 25° C. After confirming that the pH value reached a specified value, a raw material aqueous solution and a sodium tungstate aqueous solution were supplied to cause the nuclei generated in the nucleation step to grow.

After a lapse of 7 minutes (2.9% of the entire time of the particle growth step) from the start of the particle growth step, while continuing to supply the raw material aqueous solution, a ceramic diffusing tube (Kinoshita Rika Kogyo) having a pore size of 20 μm to 30 μm was used to blow nitrogen into the reaction aqueous solution to adjust the reaction atmosphere to a nonoxidizing atmosphere having an oxygen concentration of 2% by volume (switching operation 1).

After 150 minutes from the start of the switching operation 1 (62.5% with respect to the entire time of the particle growth step), while continuing the supply of the raw material aqueous solution, atmospheric air was blown into the reaction tank and the reaction atmosphere was adjusted to an air atmosphere (switching operation 2).

After a lapse of 20 minutes from the start of the switching operation 2 (8.3% with respect to the entire time of the particle growth step), the switching operation 1 was performed again.

After 63 minutes from the start of the switching operation 1 (26.3% with respect to the entire time of the particle growth step), supply of all aqueous solutions into the reaction tank was stopped, and the particle growth step was terminated. In the particle growth step, a 25% by mass sodium hydroxide aqueous solution and 25% by mass ammonia water were supplied in a timely manner to maintain the pH value and the ammonium ion concentration of the reaction aqueous solution within the above ranges.

At the end of the particle growth step, the concentration of the product in the reaction aqueous solution was 86 g/L. After that, the obtained product was washed with water, filtered, and dried to obtain a powdery composite hydroxide.

b) Evaluation of the Composite Hydroxide
[Composition]

With this composite hydroxide as a sample, the elemental fraction was measured using an ICP emission spectroscopic analyzer (ICPE-9000, manufactured by Shimadzu Corporation), and this composite hydroxide was confirmed to be represented by the general formula:

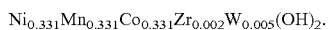

$Ni_{0.331}Mn_{0.331}Co_{0.331}Zr_{0.002}W_{0.005}(OH)_2$.

[Particle Structure]

By observing the composite hydroxide with a field emission type scanning electron microscope (FE-SEM: JSM-6360LA, manufactured by JEOL Ltd.), it was confirmed that this composite hydroxide was constructed by secondary particles that were mostly spherical and had substantially a uniform particle size. In addition, a part of the composite hydroxide was embedded in resin, and a cross section of the secondary particles was made observable by performing a cross sectional polishing process, and observed using a FE-SEM. As a result, the secondary particles of the composite hydroxide were confirmed to have a center portion formed by an aggregate of fine primary particles, and one layered structure on the outside of that center portion in which a high-density layer formed by an aggregate of plate-shaped primary particles, and low-density layer formed by an aggregate of fine primary particles were layered, and further having an outer-shell layer formed by an aggregate of plate-shaped primary particle layered on the outside thereof.

At this time, the average particle size of the primary particles was measured and calculated, and as a result, the average primary particle size of the fine primary particles was 0.2 μm and the average primary particle size of the plate-shaped primary particles was 0.5 μm. Furthermore, the center portion ratio to particle size, the total high-density layer ratio to particle size, the high-density layer ratio to particle size, the low-density layer ratio to particle size, and the outer-shell layer ratio to particle size were also measured and calculated to be 67%, 12.5%, 8.5%, 4%, and 4%, respectively.

[Average Particle Size and Particle Size Distribution]

Measurement of the average particle size of secondary particles of the composite hydroxide and measurement of d10 and d90 were performed using a laser light diffraction scattering type particle size analyzer (Microtrac HRA, manufactured by Nikkiso Co., Ltd.), and the value of [(d90−d10)/average particle size], which is an index indicating the spread of the particle size distribution was calculated. As a result, the average particle size of the composite hydroxide was 5.1 μm, and the value of [(d90−d10)/average particle size] was 0.42.

c) Production of Positive Electrode Active Material

A heat treatment step was performed on the obtained composite hydroxide for 12 hours at 120° C. in a flow of air in an air atmosphere (oxygen concentration: 21% by volume) to obtain heat-treated particles. Thereafter, as a mixing step, the heat-treated particles and lithium carbonate were mixed so that the value of Li/Me became 1.14, and sufficiently mixed using a shaker mixer (TURBULA Type T 2 C, manufactured by Willy A Bachofen (WAB)) to obtain a lithium mixture.

Next, a firing step was performed on this lithium mixture, and in this firing step, in a flow of air in an air atmosphere (oxygen concentration: 21% by volume), the temperature was raised from room temperature to 950° C. at a rate of temperature rise of 2.5° C./min and maintained and fired at this temperature for 4 hours, and then cooled to room temperature at a cooling rate of about 4° C./min. Aggregation or light sintering occurred in the positive electrode active material obtained in this way, so a cracking step was performed, and this positive electrode active material was cracked to adjust the average particle size and particle size distribution.

d) Evaluation of the Positive Electrode Active Material
[Composition]

Using this positive electrode active material as a sample, the elemental fraction was measured using an ICP emission spectroscopic analyzer, and as a result, it was confirmed that this positive electrode active material was represented by the general formula:

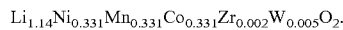

$Li_{1.14}Ni_{0.331}Mn_{0.331}Co_{0.331}Zr_{0.002}W_{0.005}O_2$.

[Average Particle Size and Particle Size Distribution]

Using a laser light diffraction scattering type particle size analyzer, the average particle size of the positive electrode active material was measured, and d10 and d90 were also measured to calculate the index indicating the spread of the particle size distribution [(d90−d10)/average particle size]. As a result, the average particle size of the positive electrode active material was 5.1 μm, and [(d90−d10)/average particle size] was 0.41.

[Particle Structure]

When the positive electrode active material was observed using a FE-SEM (refer to FIG. 2), it was confirmed that the positive electrode active material was constructed by secondary particles having substantially a spherical shape and uniform particle size. In addition, a part of this positive electrode active material was embedded in a resin, and a cross section of the secondary particles was made observable by performing a cross sectional polishing process, and observed using a FE-SEM (see FIG. 3). As a result, it was confirmed that this positive electrode active material was constructed by substantially spherical secondary particles in which a plurality of primary particles were aggregated, and the secondary particles had a hollow structure in which an internal space (the center portion of the hollow structure) was provided at the center of the secondary particles, and on the outside thereof, the outer-shell portion was arranged in a substantially spherical shell shape. The outer-shell portion ratio to particle size was 17%. Moreover, of the secondary particles of which the entire particle can be observed from surface observation of the particle, 6.5% of that number of secondary particles were observed to have through holes in the outer-shell portion connecting an internal space existing in the center portion of the secondary particle to the outside. Furthermore, from the cross section observation of the particles, the inner diameter (average inner diameter) of the through holes was 0.4 μm and the through hole inner diameter ratio to outer-shell portion was 0.46.

[Specific Surface Area, Tap Density, and Specific Surface Area Per Unit Volume]

Using this positive electrode active material as a sample, the specific surface area was measured with a flow type gas adsorption method specific surface area measuring apparatus (Multisorb, manufactured by Yuasa Ionics Inc.), and the tap density was measured with a tapping machine (KRS-406, manufactured by Kuramochi Kagaku Kikai Seisakusho). As a result, the specific surface area of this positive electrode active material was 1.52 $m^2/g$, and the tap density was 1.52 $g/cm^3$. In addition, the specific surface area per unit volume obtained from these measurements was 2.31 $m^2/cm^3$.

e) Production of Secondary Battery 52.5 mg of the positive electrode active material obtained above, 15 mg of acetylene black and 7.5 mg of PTEE were mixed and press molded to a diameter of 11 mm and a thickness of 100 μm at a pressure of 100 MPa, then dried at 120° C. for 12 hours in a vacuum dryer to prepare a positive electrode (1).

Next, using the positive electrode (1), a 2032 type coin battery (B) having the structure illustrated in FIG. 6 was made in a glove box in argon (Ar) atmosphere that was managed to have a dew point of −80° C. Lithium metal having a diameter of 17 mm and a thickness of 1 mm was used for the negative electrode (2) of this 2032 type coin battery, and a mixed solution having equal amounts of ethylene carbonate (EC) and diethyl carbonate (DEC) using 1 M of $LiClO_4$ as a supporting electrolyte (manufactured by Tomiyama Pure Chemical Industries, Ltd.) was used as an electrolytic solution. In addition, a porous polyethylene film having a thickness of 25 μm was used for the separator (3). Incidentally, the 2032 type coin battery (B) has a gasket (4), and is assembled into a coin-shaped battery with a positive electrode can (5), and a negative electrode can (6).

f) Battery Evaluation
[Initial Discharge Capacity]

After preparing the 2032 type coin battery, the battery was left for about 24 hours, and after the open circuit voltage OCV (Open Circuit Voltage) stabilized, with a current density with respect to the positive electrode of 0.1 $mA/cm^2$, the battery was charged to a cutoff voltage of 4.3 V, then after a 1-hour pause, the initial discharge capacity was determined by performing a charge/discharge test to measure the discharge capacity when the battery was discharged until the cut-off voltage reached 3.0 V. As a result, the initial discharge capacity was 159.6 mAh/g. Note that when measuring the initial discharge capacity, a multichannel voltage/current generator (R6741A, manufactured by Advantest Corporation) was used.

[Positive Electrode Resistance]

Figure 7:
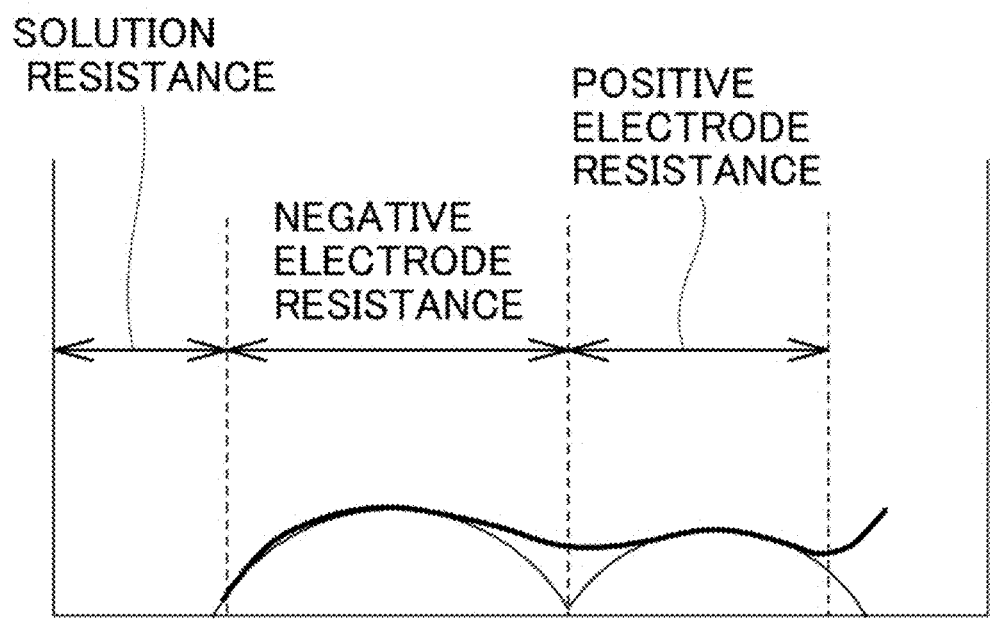
FIG. 7 is a schematic explanatory diagram of an example of measurement of impedance evaluation and an equivalent circuit used for analysis.
Figure 7:
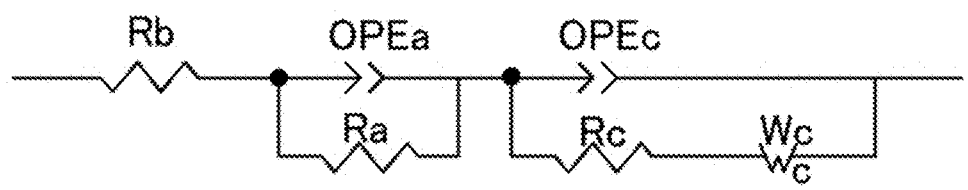

Using a 2032 type coin battery charged at a charging potential of 4.1 V, the resistance value was measured by the AC impedance method. For the measurement, a frequency response analyzer and a potentio-galvanostat (manufactured by Solartron) were used to obtain a Nyquist plot as illustrated in FIG. 7. The plot is expressed as the sum of characteristic curves indicating the solution resistance, the negative electrode resistance and capacity, and the positive electrode resistance and capacity, so a fitting calculation is performed using an equivalent circuit, and the positive electrode resistance value was calculated. As a result, the positive electrode resistance was 1.012Ω.

[Cycle Characteristics]

The charge/discharge test described above was repeated, and by measuring the 500-cycle capacity, the 500-cycle capacity retention rate with respect to the initial discharge capacity was calculated. As a result, it was confirmed that the 500-cycle capacity retention rate was 82.0%.

Tables 1 to 4 give the preparation conditions of the transition metal composite hydroxide and the positive electrode active material, the characteristics thereof, and the results of various performances of the battery using them. The results of Examples 2 to 18 and Comparative Examples 1 to 9 are given in Tables 1 to 4 as well.

Example 2

Except that in the particle growth step, the switching operation 1 was performed 7 minutes (2.9% of the entire time of the particle growth step) from the start of the particle growth step; the switching operation 2 was performed 96 minutes (39.5% of the entire time of the particle growth step) from switching operation 1; after that, the switching operation 1 was performed 20 minutes (8.2% of the entire time of the particle growth step) from switching operation 2; and after that the crystallization reaction was continued for 120 minutes (49.4% of the entire time of the particle growth step), a composite hydroxide, a positive electrode active material, and a secondary battery were produced and evaluated in the same way as in Example 1.

Example 3

Except that in the particle growth step, the switching operation 1 was performed 24 minutes (10% of the entire time of the particle growth step) from the start of the particle growth step; the switching operation 2 was performed 150 minutes (62.5% of the entire time of the particle growth step) from switching operation 1; after that, the switching operation 1 was performed 20 minutes (8.3% of the entire time of the particle growth step) from switching operation 2; and after that the crystallization reaction was continued for 46 minutes (19.2% of the entire time of the particle growth step), a composite hydroxide, a positive electrode active material, and a secondary battery were produced and evaluated in the same way as in Example 1.

Example 4

Except that in the particle growth step, the switching operation 1 was performed 24 minutes (10% of the entire time of the particle growth step) from the start of the particle growth step; the switching operation 2 was performed 96 minutes (40% of the entire time of the particle growth step) from switching operation 1; after that, the switching operation 1 was performed 20 minutes (8.3% of the entire time of the particle growth step) from switching operation 2; and after that the crystallization reaction was continued for 100 minutes (41.7% of the entire time of the particle growth step), a composite hydroxide, a positive electrode active material, and a secondary battery were produced and evaluated in the same way as in Example 1.

Example 5

Except that in the particle growth step, the switching operation 1 was performed 7 minutes (2.9% of the entire time of the particle growth step) from the start of the particle growth step; the switching operation 2 was performed 168 minutes (70% of the entire time of the particle growth step) from switching operation 1; after that, the switching operation 1 was performed 20 minutes (8.3% of the entire time of the particle growth step) from switching operation 2; and after that the crystallization reaction was continued for 45 minutes (18.8% of the entire time of the particle growth step), a composite hydroxide, a positive electrode active material, and a secondary battery were produced and evaluated in the same way as in Example 1.

Example 6

Except that in the particle growth step, the switching operation 1 was performed 24 minutes (10% of the entire time of the particle growth step) from the start of the particle growth step; the switching operation 2 was performed 60 minutes (25% of the entire time of the particle growth step) from switching operation 1; after that, the switching operation 1 was performed 36 minutes (15% of the entire time of the particle growth step) from switching operation 2; and after that the crystallization reaction was continued for 120 minutes (50% of the entire time of the particle growth step), a transition metal composite hydroxide, a positive electrode active material, and a secondary battery were produced and evaluated in the same way as in Example 1.

Example 7

Except that in the particle growth step, the switching operation 1 was performed 12 minutes (5% of the entire time of the particle growth step) from the start of the particle growth step; the switching operation 2 was performed 144 minutes (60% of the entire time of the particle growth step) from switching operation 1; after that, the switching operation 1 was performed 12 minutes (5% of the entire time of the particle growth step) from switching operation 2; and after that the crystallization reaction was continued for 72 minutes (30% of the entire time of the particle growth step), a transition metal composite hydroxide, a positive electrode active material, and a secondary battery were produced and evaluated in the same way as in Example 1.

Example 8

Except that in the particle growth step, the switching operation 1 was performed 7 minutes (2.9% of the entire time of the particle growth step) from the start of the particle growth step; the switching operation 2 was performed 120 minutes (50% of the entire time of the particle growth step) from switching operation 1; after that, the switching operation 1 was performed 36 minutes (15% of the entire time of the particle growth step) from switching operation 2; and after that the crystallization reaction was continued for 77 minutes (32.1% of the entire time of the particle growth step), a transition metal composite hydroxide, a positive electrode active material, and a secondary battery were produced and evaluated in the same way as in Example 1.

Example 9

Except that in the particle growth step, the switching operation 1 was performed 7 minutes (3% of the entire time of the particle growth step) from the start of the particle growth step; the switching operation 2 was performed 120 minutes (52.4% of the entire time of the particle growth step) from switching operation 1; after that, the switching operation 1 was performed 18 minutes (7.9% of the entire time of the particle growth step) from switching operation 2; after that the crystallization reaction was continued for 33 minutes (14.4% of the entire time of the particle growth step); further after that, the switching operation 2 was performed 18 minutes (7.9% of the entire time of the particle growth step) from switching operation 1; and after that the crystallization reaction was continued for 33 minutes (14.4% of the entire time of the particle growth step) from switching operation 2, a transition metal composite hydroxide, a positive electrode active material, and a secondary battery were produced and evaluated in the same way as in Example 1.

Comparative Example 1

Figure 4:
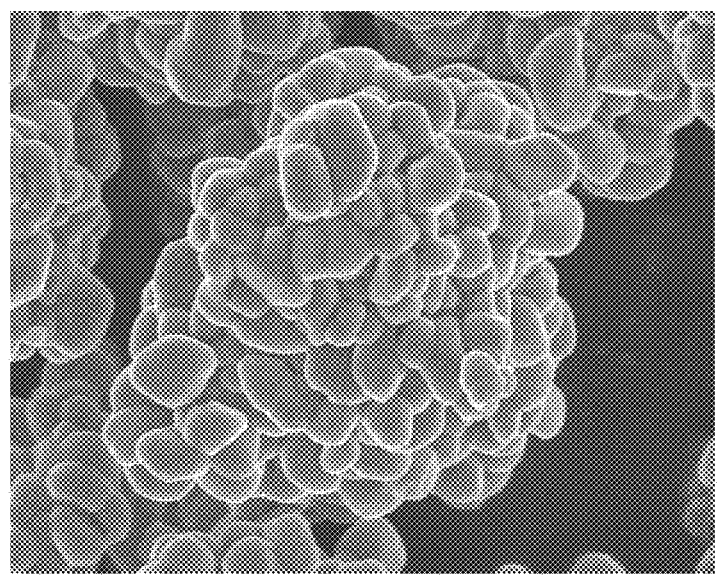
FIG. 4 is an FE-SEM image illustrating the surface of a transition metal-containing composite hydroxide obtained in Comparative Example 1.
Figure 5:
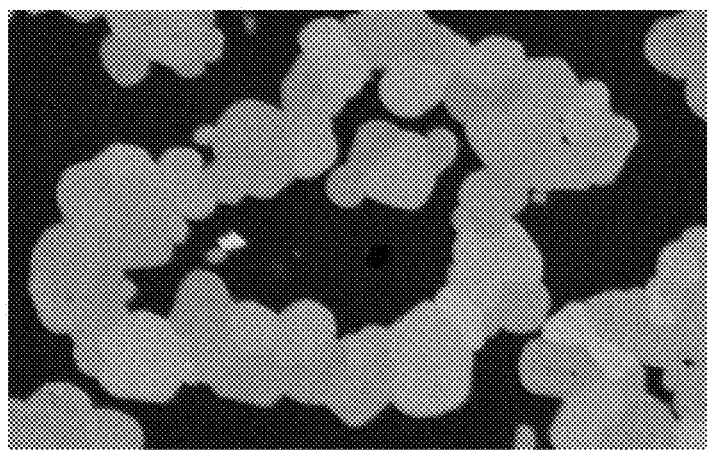
FIG. 5 is an FE-SEM image illustrating a cross section of a positive electrode active material for a nonaqueous electrolyte secondary battery obtained in Comparative Example 1.

Except that in the particle growth step, the switching operation 1 was performed 7 minutes (2.9% of the entire time of the particle growth step) from the start of the particle growth step; and after that the crystallization reaction was continued for 233 minutes (97.1% of the entire time of the particle growth step), a composite hydroxide was produced and evaluated in the same way as in Example 1. FIG. 4 and FIG. 5 illustrate FE-SEM images of the surface and the cross section of the positive electrode active material obtained in Comparative Example 1, respectively. As understood from FIG. 5, in the obtained positive electrode active material, the particle structure of the secondary particles was a hollow structure without through holes.

Comparative Example 2

Except that in the particle growth step, the switching operation 1 was performed 72 minutes (30% of the entire time of the particle growth step) from the start of the particle growth step; the switching operation 2 was performed 120 minutes (50% of the entire time of the particle growth step) from switching operation 1; after that, the switching operation 1 was performed 3 minutes (1.25% of the entire time of the particle growth step) from switching operation 2; and after that the crystallization reaction was continued for 45 minutes (18.75% of the entire time of the particle growth step), a transition metal composite hydroxide, a positive electrode active material, and a secondary battery were produced and evaluated in the same way as in Example 1. Incidentally, in the obtained positive electrode active material, the particle structure of the secondary particles was a hollow structure without through holes.

Comparative Example 3

Except that in the particle growth step, the switching operation 1 was performed 7 minutes (2.9% of the entire time of the particle growth step) from the start of the particle growth step; the switching operation 2 was performed 96 minutes (40% of the entire time of the particle growth step) from switching operation 1; after that, the switching operation 1 was performed 96 minutes (40% of the entire time of the particle growth step) from switching operation 2; and after that the crystallization reaction was continued for 41 minutes (17.1% of the entire time of the particle growth step), a transition metal composite hydroxide, a positive electrode active material, and a secondary battery were produced and evaluated in the same way as in Example 1. Incidentally, in the obtained positive electrode active material, the particle structure of the secondary particles was a hollow structure without through holes.

Comparative Example 4

Except that in the particle growth step, the switching operation 1 was performed 7 minutes (2.9% of the entire time of the particle growth step) from the start of the particle growth step; the switching operation 2 was performed 15 minutes (6.3% of the entire time of the particle growth step) from switching operation 1; after that, the switching operation 1 was performed 20 minutes (8.3% of the entire time of the particle growth step) from switching operation 2; and after that the crystallization reaction was continued for 198 minutes (82.5% of the entire time of the particle growth step), a transition metal composite hydroxide, a positive electrode active material, and a secondary battery were produced and evaluated in the same way as in Example 1. Incidentally, in the obtained positive electrode active material, the particle structure of the secondary particles was a hollow structure without through holes.

TABLE 1

| | Particle Growth Step (Reaction Time of Each Stage (%)) | | | | | |
|---|---|---|---|---|---|---|
| | Start → Switching Operation 1 | Switching Operation 1→2 | Switching Operation 2→1 | Switching Operation 1→2 | Switching Operation 1→2 | Switching Operation 2→4 |
| | First Stage | Second Stage | Third Stage | Fourth Stage | Fifth Stage | Sixth Stage |
| Example 1 | 2.9 | 62.5 | 8.3 | 26.3 | — | — |
| Example 2 | 2.9 | 39.5 | 8.2 | 49.4 | — | — |
| Example 3 | 10 | 62.5 | 8.3 | 19.2 | — | — |
| Example 4 | 10 | 40 | 8.3 | 41.7 | — | — |
| Example 5 | 2.9 | 70 | 8.3 | 18.8 | — | — |
| Example 6 | 10 | 25 | 15 | 50 | — | — |
| Example 7 | 5 | 60 | 5 | 30 | — | — |
| Example 8 | 2.9 | 50 | 15 | 32.1 | — | — |
| Example 9 | 3 | 52.4 | 7.9 | 14.4 | 7.9 | 14.4 |
| CE 1 | 2.9 | 97.1 | — | — | — | — |
| CE 2 | 30 | 50 | 1.25 | 18.75 | — | — |
| CE 3 | 2.9 | 40 | 40 | 17.1 | — | — |
| CE 4 | 2.9 | 6.3 | 8.3 | 82.5 | — | — |

*CE: Comparative Example

TABLE 2

| | Composite Hydroxide | | | | | | | |
|---|---|---|---|---|---|---|---|---|
| | Fine Primary Particles (μm) | Plate-shaped Primary Particles (μm) | Center Portion Ratio to Particle Size (%) | High-density Layer Ratio to Particle Size (%) | Low-density Layer Ratio to Particle Size (%) | Outer-shell Layer Ratio to Particle Size (%) | Secondary Particle Average Particle Size (μm) | (d90 − d10)/ Average Particle Size |
| Example 1 | 0.2 | 0.5 | 67 | 8.5 | 4 | 4 | 5.1 | 0.42 |
| Example 2 | 0.2 | 0.5 | 68 | 7 | 4 | 5 | 5.2 | 0.43 |
| Example 3 | 0.3 | 0.6 | 73 | 9 | 4 | 3.5 | 5.6 | 0.41 |
| Example 4 | 0.2 | 0.5 | 72 | 6 | 4 | 4 | 5.4 | 0.42 |
| Example 5 | 0.2 | 0.5 | 64 | 11 | 3.5 | 3.5 | 5.3 | 0.42 |
| Example 6 | 0.2 | 0.6 | 67 | 5 | 8 | 5 | 5.6 | 0.43 |
| Example 7 | 0.2 | 0.5 | 69 | 8 | 3 | 4 | 5.3 | 0.43 |
| Example 8 | 0.2 | 0.5 | 60 | 7 | 8 | 5 | 5.7 | 0.41 |
| Example 9 | 0.2 | 0.5 | 58 | (1)6 (2)5 | (1)3 (2)2.5 | 3.5 | 5.8 | 0.44 |
| CE 1 | 0.2 | 0.6 | 66 | — | — | 17 | 5.1 | 0.41 |
| CE 2 | 0.2 | 0.6 | 75 | 8 | 1.5 | 3 | 5.5 | 0.45 |
| CE 3 | 0.2 | 0.6 | 62 | 5 | 11 | 3 | 5.3 | 0.44 |
| CE 4 | 0.2 | 0.5 | 65 | 1.5 | 2 | 14 | 5.4 | 0.44 |

*CE: Comparative Example

TABLE 3

| | Positive Electrode Active Material | | | | | |
|---|---|---|---|---|---|---|
| | Particle Structure | Average Particle Size (μm) | (d90 − d10)/ Average Particle Size | Outer-Shell Portion Ratio to Particle Size (%) | Average Through Hole Diameter (μm) | Through Hole Inner Diameter Ratio to Outer-Shell Portion |
| Example 1 | Hollow/Through Hole | 5.1 | 0.41 | 17 | 0.4 | 0.46 |
| Example 2 | Hollow/Through Hole | 5.1 | 0.41 | 17 | 0.5 | 0.58 |
| Example 3 | Hollow/Through Hole | 5.2 | 0.40 | 12 | 0.6 | 0.96 |
| Example 4 | Hollow/Through Hole | 5.2 | 0.41 | 13 | 0.6 | 0.89 |
| Example 5 | Hollow/Through Hole | 5.1 | 0.40 | 12 | 0.3 | 0.49 |
| Example 6 | Hollow/Through Hole | 5.3 | 0.43 | 11 | 0.5 | 0.86 |
| Example 7 | Hollow/Through Hole | 5.1 | 0.43 | 12 | 0.3 | 0.49 |
| Example 8 | Hollow/Through Hole | 5.3 | 0.41 | 12 | 0.7 | 1.10 |
| Example 9 | Hollow/Through Hole | 5.1 | 0.43 | 15 | 0.6 | 0.78 |
| CE 1 | Hollow | 4.9 | 0.39 | 17 | — | — |
| CE 2 | Hollow | 5.2 | 0.44 | 12 | — | — |
| CE 3 | Hollow | 5.2 | 0.44 | 16 | — | — |
| CE 4 | Hollow | 5.1 | 0.43 | 15 | — | — |

*CE: Comparative Example

TABLE 4

| | Positive Electrode Active Material | | | | | |
|---|---|---|---|---|---|---|
| | BET Specific Surface Area (m²/g) | Tap Density (g/cm³) | Specific Surface Area Per Unit Volume (m²/cm³) | Initial Charge Capacity (mAh/g) | Positive Electrode Resistance (Ω) | Capacity Retention Rate (%) |
| Example 1 | 1.52 | 1.52 | 2.31 | 159.6 | 1.032 | 82.0 |
| Example 2 | 1.48 | 1.56 | 2.31 | 158.8 | 1.014 | 81.5 |
| Example 3 | 1.64 | 1.45 | 2.38 | 158.5 | 0.991 | 82.1 |
| Example 4 | 1.52 | 1.32 | 2.01 | 158.0 | 0.924 | 81.3 |
| Example 5 | 1.36 | 1.56 | 2.12 | 158.1 | 1.059 | 80.6 |
| Example 6 | 1.71 | 1.40 | 2.39 | 158.3 | 0.985 | 82.2 |
| Example 7 | 1.53 | 1.35 | 2.07 | 158.1 | 0.991 | 81.4 |
| Example 8 | 1.52 | 1.34 | 2.04 | 158.2 | 0.988 | 81.3 |
| Example 9 | 1.39 | 1.57 | 2.18 | 158.0 | 1.033 | 80.8 |
| CE 1 | 1.21 | 1.51 | 1.83 | 158.8 | 1.318 | 80.7 |
| CE 2 | 1.33 | 1.49 | 1.98 | 158.0 | 1.322 | 80.6 |

TABLE 4-continued

| | Positive Electrode Active Material | | | | | |
|---|---|---|---|---|---|---|
| | BET Specific Surface Area ($m^2/g$) | Tap Density ($g/cm^2$) | Specific Surface Area Per Unit Volume ($m^2/cm^3$) | Initial Charge Capacity (mAh/g) | Positive Electrode Resistance ($\Omega$) | Capacity Retention Rate (%) |
| CE 3 | 1.23 | 1.47 | 1.81 | 158.2 | 1.301 | 80.5 |
| CE 4 | 1.22 | 1.50 | 1.83 | 158.1 | 1.315 | 80.8 |

*CE: Comparative Example

REFERENCE SIGNS LIST

1 Positive electrode (electrode for evaluation)
2 Negative electrode
3 Separator
4 Gasket
5 Positive electrode can
6 Negative electrode can
B 2032 type coin battery
21 Center portion
22 High-density layer
23 Low-density layer
24 Outer-shell layer
25 Outer-shell portion

The invention claimed is:

1. A transition metal-containing composite hydroxide comprising secondary particles respectively formed by aggregates of plate-shaped primary particles and fine primary particles having a smaller particle size than the plate-shaped primary particles;
   the secondary particles comprising: a center portion constructed by the fine primary particles; and an outer-shell portion having a high-density layer formed on the outside of the center portion and constructed by the plate-shaped primary particles, a low-density layer formed on the outside of the high-density layer and constructed by the fine primary particles, and an outer-shell layer formed on the outside of the low-density layer and constructed by the plate-shaped primary particles.

2. The transition metal-containing composite hydroxide according to claim 1, wherein the average ratio of the outer diameter of the center portion with respect to the particle size of the secondary particles is within a range of 35% to 85%; the average ratio of the sum of the thicknesses of the high-density layer and the outer shell layer with respect to the particle size of the secondary particles is within a range of 5% to 30%; the average ratio of the thickness of the low-density layer with respect to the particle size of the secondary particles is within a range of 2% to 20%; and the ratio of respective thicknesses of the high-density layer and the outer-shell layer with respect to the particle size of the secondary particles is within a range of 2.5% to 15%.

3. The transition metal-containing composite hydroxide according to claim 1, wherein the outer-shell portion further comprises between the low-density layer and the outer-shell layer: a second high-density layer formed on the outside of the low-density layer and constructed by the plate-shaped primary particles; and a second low-density layer formed on the outside of the second high-density layer and constructed by the fine primary particles.

4. The transition metal-containing composite hydroxide according to claim 3, wherein the average ratio of the outer diameter of the center portion with respect to the particle size of the secondary particles is within a range of 35% to 80%; the average ratio of the sum of the thicknesses of the high-density layer, the second high-density layer, and the outer-shell layer with respect to the particle size of the secondary particles is within a range of 8% to 30%; the average ratio of the sum of the thicknesses of the low-density layer and the second low-density layer with respect to the particle size of the secondary particles is within a range of 2% to 20%; the ratio of the respective thicknesses of the high-density layer, the second high-density layer, and the outer-shell layer with respect to the particle size of the secondary particles is 2.5% to 15%; and the ratio of the respective thicknesses of the low-density layer and the second low-density layer with respect to the particle size of the secondary particles is 1% to 10%.

5. The transition metal-containing composite hydroxide according to claim 1, wherein the average particle size of the plate-shaped primary particles is within a range of 0.3 µm to 3 µm, and the average primary particle size of the fine primary particles is smaller than the average particle size of the plate-shaped primary particles and is within a range of 0.01 µm to 0.3 µm.

6. The transition metal-containing composite hydroxide according to claim 1, wherein the average particle size of the secondary particles is within a range of 1 µm to 15 µm, and the value of [(d90−d10)/average particle size] as an index indicating the spread of the particle size distribution of the secondary particles is 0.65 or less.

7. The transition metal-containing composite hydroxide according to claim 1, having a composition represented by a general formula (A): $Ni_xMn_yCo_zM_t(OH)_{2+a}$ (where x+y+z+t=1, 0.3≤x≤0.95, 0.05≤y≤0.55, 0≤z≤0.4, 0≤t≤0.1, 0≤a≤0.5, and M is one or more additional element selected from the group consisting of Mg, Ca, Al, Ti, V, Cr, Zr, Nb, Mo, Hf, Ta, and W).

8. The transition metal-containing composite hydroxide according to claim 7, wherein the additional element M is uniformly distributed inside the secondary particles of the transition metal composite hydroxide, and/or a surface of the secondary particles of the transition metal composite hydroxide is coated by a compound that includes the additional element M.

9. A method for producing a transition metal-containing composite hydroxide as a precursor of a positive electrode active material for a secondary battery, by mixing a raw material aqueous solution including at least a transition metal element and an aqueous solution including a complexing agent to form a reaction aqueous solution, and performing a crystallization reaction, the method comprising:
   a nucleation step in which nucleation is performed in an oxidizing atmosphere in which the pH value at a standard liquid temperature of 25° C. of the reaction aqueous solution is adjusted to be within a range of 12.0 to 14.0, and the oxygen concentration exceeds 5% by volume; and a particle growth step in which the pH value at a standard liquid temperature 25° C. of the reaction aqueous solution including the nuclei obtained in the nucleation step is adjusted to lower than the pH value of the nucleation step and to be within a range of 10.5 to 12.0 to cause to growth of the nuclei; and the particle growth step comprising:

a first stage of maintaining the oxidizing atmosphere from the start of the particle growth step;

a second stage after the first stage of switching from the oxidizing atmosphere to a non-oxidizing atmosphere in which the oxygen concentration is 5% by volume or less, and maintaining the non-oxidizing atmosphere;

a third stage after the second stage of switching from the non-oxidizing atmosphere to the oxidizing atmosphere, and maintaining the oxidizing atmosphere; and a fourth stage after the third stage of switching from the oxidizing atmosphere to the non-oxidizing atmosphere, and maintaining the non-oxidizing atmosphere.

10. The method for producing a transition metal-containing composite hydroxide according to claim 9, wherein the time of the first stage is within a range of 0.5% to 20% with respect to the total time of the particle growth step; the time of the second stage is within a range of 10% to 80% with respect to the total time of the particle growth step; the time of the third stage is within a range of 2% to 30% with respect to the total time of the particle growth step; and the time of the fourth stage is within a range of 10% to 80% with respect to the total time of the particle growth step.

11. The method for producing a transition metal-containing composite hydroxide according to claim 9 further comprising:

a fifth stage after the fourth stage of switching from the non-oxidizing atmosphere to the oxidizing atmosphere, and maintaining the oxidizing atmosphere; and a sixth stage after the fifth stage of switching from the oxidizing atmosphere to the non-oxidizing atmosphere, and maintaining the non-oxidizing atmosphere.

12. The method for producing a transition metal-containing composite hydroxide according to claim 11, wherein the time of the first stage is within a range of 0.5% to 20% with respect to the total time of the particle growth step; the time of the second stage is within a range of 10% to 75% with respect to the total time of the particle growth step; the time of the third stage is within a range of 2% to 30% with respect to the total time of the particle growth step; the time of the fourth stage is within a range of 10% to 75% with respect to the total time of the particle growth step; the time of the fifth stage is within a range of 2% to 30% with respect to the total time of the particle growth step; and the time of the sixth stage is within a range of 10% to 75% with respect to the total time of the particle growth step.

13. The method for producing a transition metal-containing composite hydroxide according to claim 9 wherein the transition metal-containing composite hydroxide has a composition represented by a general formula (A): $Ni_xMn_yCo_zM_t(OH)_{2+a}$ (where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element selected from the group consisting of Mg, Ca, Al, Ti, V, Cr, Zr, Nb, Mo, Hf, Ta, and W).

14. The method for producing a transition metal-containing composite hydroxide according to claim 13, wherein after the particle growth step, a coating step is provided for coating the surface of the transition metal-containing composite hydroxide with a compound that includes the additional element M.

15. A method for producing a positive electrode active material for a nonaqueous electrolyte secondary battery, comprising:

a mixing step of mixing the transition metal-containing composite hydroxide according to claim 1 and a lithium compound to form a lithium mixture; and a firing step of firing the lithium mixture in an oxidizing atmosphere at a temperature within a range of 650° C. to 1000° C. to obtain the positive electrode active material for the nonaqueous electrolyte secondary battery constructed by a lithium transition metal-containing composite oxide.

16. The method for producing a positive electrode active material for a nonaqueous electrolyte secondary battery according to claim 15, wherein a mixing amount of the lithium compound is adjusted so that the ratio of the number of atoms of lithium included in the lithium mixture with respect to the total number of atoms of the metal elements other than lithium is within a range of 0.95 to 1.5.

17. The method for producing a positive electrode active material for a nonaqueous electrolyte secondary battery according to claim 15 further comprising a heat treatment step before the mixing step of heat treating the transition metal composite hydroxide at a temperature within a range of 105° C. to 750° C.

18. The method for producing a positive electrode active material for a nonaqueous electrolyte secondary battery according to claim 15, wherein the lithium transition metal-containing composite oxide is represented by a general formula (B): $Li_{1+u}Ni_xMn_yCo_zM_tO_2$ (where $-0.05 \leq u \leq 0.50$, $x+y+z+t=1$, $0.3 \leq x \leq 0.95$, $0.05 \leq y \leq 0.55$, $0 \leq z \leq 0.4$, $0 \leq t \leq 0.1$, and M is at least one or more additional element selected from among the group consisting of Mg, Ca, Al, Ti, V, Cr, Zr, Nb, Mo, Hf, Ta, and W).

* * * * *